(12) United States Patent
Okabe et al.

(10) Patent No.: US 12,457,755 B2
(45) Date of Patent: Oct. 28, 2025

(54) DISPLAY DEVICE AND PRODUCTION METHOD THEREFOR

(71) Applicant: SHARP KABUSHIKI KAISHA, Sakai (JP)

(72) Inventors: Tohru Okabe, Sakai (JP); Ryosuke Gunji, Sakai (JP); Shinsuke Saida, Sakai (JP); Shinji Ichikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 415 days.

(21) Appl. No.: 17/908,186

(22) PCT Filed: Mar. 2, 2020

(86) PCT No.: PCT/JP2020/008698
§ 371 (c)(1),
(2) Date: Aug. 30, 2022

(87) PCT Pub. No.: WO2021/176519
PCT Pub. Date: Sep. 10, 2021

(65) Prior Publication Data
US 2023/0117774 A1 Apr. 20, 2023

(51) Int. Cl.
*H10K 59/80* (2023.01)
*H10D 1/00* (2025.01)
(Continued)

(52) U.S. Cl.
CPC ............. *H10D 1/043* (2025.01); *H10D 1/716* (2025.01); *H10K 59/80518* (2023.02);
(Continued)

(58) Field of Classification Search
CPC ....... H10K 50/816; H10K 50/805–828; H10K 2102/10–20; H10K 59/00; H10K 59/40–70
See application file for complete search history.

(56) References Cited

U.S. PATENT DOCUMENTS

| | | | | |
|---|---|---|---|---|
| 2016/0118625 | A1* | 4/2016 | Uesaka | H10K 59/351 |
| | | | | 257/40 |
| 2016/0343991 | A1* | 11/2016 | Kagotani | H10K 59/00 |
| 2019/0036047 | A1* | 1/2019 | Zhou | H10K 59/1213 |
| 2021/0134899 | A1* | 5/2021 | Peng | H10K 50/816 |

FOREIGN PATENT DOCUMENTS

| CN | 110047879 A | 7/2019 |
|---|---|---|
| CN | 110148621 A | 8/2019 |

(Continued)

*Primary Examiner* — Steven B Gauthier
*Assistant Examiner* — Adam D Weiland
(74) *Attorney, Agent, or Firm* — ScienBiziP, P.C.

(57) ABSTRACT

A display device, includes: a substrate; a thin film transistor layer including a plurality of thin film transistors; a light-emitting element layer including a plurality of light-emitting elements; a display region displaying an image; and an electronic component being disposed on a back face side of the display region with respect to the substrate, wherein the display region includes a first display region and a second display region, each of the plurality of light-emitting elements includes a first light-emitting element and a second light-emitting element, each of the first light-emitting element and the second light-emitting element, the first electrode of the first light-emitting element includes a first reflective conductive layer, and a first upper transparent conductive layer, the first electrode of the second light-emitting element includes a second transparent conductive layer, and the second transparent conductive layer is crystallized and is thicker than the first upper transparent conductive layer.

23 Claims, 29 Drawing Sheets

(51) Int. Cl.
*H10D 1/68* (2025.01)
*H10D 86/40* (2025.01)
*H10D 86/60* (2025.01)
*H10K 59/121* (2023.01)

(52) U.S. Cl.
CPC ....... *H10K 59/80524* (2023.02); *H10D 86/40* (2025.01); *H10D 86/60* (2025.01); *H10K 59/121* (2023.02); *H10K 59/878* (2023.02)

(56) References Cited

FOREIGN PATENT DOCUMENTS

| | | |
|---|---|---|
| JP | 2018-124457 A | 8/2018 |
| WO | 2020/191870 A1 | 10/2020 |

\* cited by examiner

DISPLAY DEVICE AND PRODUCTION METHOD THEREFOR

TECHNICAL FIELD

The disclosure relates to a display device and a method of manufacturing the same.

BACKGROUND ART

In recent years, self-luminous type organic Electro Luminescence (hereinafter also referred to as EL) display devices using organic EL elements have attracted attention as display devices that can replace liquid crystal display devices.

Each of the organic EL elements includes a first electrode, an organic EL layer provided on the first electrode, and a second electrode provided on the organic EL layer. As the organic EL element, a top-emission type organic EL element having an excellent light extraction efficiency has been suitably adopted. In the top-emission type organic EL element, the first electrode includes a reflective conductive layer that is formed of a reflective conductive material and reflects light emitted by the organic EL layer toward the second electrode side.

In a case where the organic EL display device is used as a display of an information terminal such as a smartphone or a tablet terminal, or in a case where the organic EL display device is used as a display for performing bidirectional communication such as in a video telephone call or a video conference, the organic EL display device is combined with a camera (so-called in-camera) that captures an image of the front face side on which an image is displayed. In such an organic EL display device provided with the in-camera, it has been proposed to dispose the camera at a position overlapping with a display region on a back face side of the organic EL display device (see PTL 1, for example).

CITATION LIST

Patent Literature

PTL 1: JP 2018-124457 A

SUMMARY

Technical Problem

In an organic EL display device including top-emission type organic EL elements, external light is reflected by a reflective conductive layer constituting a first electrode, and thus the transmittance of light transmitted through a display region is significantly low. From this, in a case where an electronic component, such as a camera that uses the light transmitted through the display region, is disposed at a position overlapping the display region on the back face side of a display panel, it is desired to increase the transmittance of light in a second display region of the display region that transmits the light used in the electronic component.

Consequently, it is conceivable to form the first electrode differently for a first display region which is a general region of the display region, and for a second display region that is positioned inside the first display region. Specifically, it is conceivable to adopt a configuration in which the first electrode in the second display region is constituted by a transparent conductive layer having light transmittance, or a configuration in which the first electrode includes a reflective conductive layer thinner than the reflective conductive layer included in the first electrode in the first display region. Accordingly, it is possible to relatively increase the transmittance of light in the second display region and increase the amount of light that can be used in an electronic component.

Incidentally, the reflective conductive layer included in the first electrode is formed of silver (Ag), a silver alloy, or the like. In the first electrode, a transparent conductive layer formed of, for example, indium tin oxide (ITO) is provided on the reflective conductive layer for the purpose of preventing corrosion of the reflective conductive layer, or the like. It is preferable that the thickness of the transparent conductive layer be relatively thin from the perspective of increasing the transmittance of light reflected by the reflective conductive layer.

However, also in the first electrode in the second display region, when the transparent conductive layer is relatively thin in the same manner as the first electrode in the first display region, and in a case where the first electrode is formed in one region out of the first display region and the second display region and then the first electrode is formed in the other region, an etching solution used for wet etching for patterning the first electrode formed later infiltrates into the first electrode formed first, thereby causing damage. This leads to an increase in characteristic variations of the organic EL element and a decrease in the yield of the organic EL display device.

The technique of the disclosure has been made in view of such a point as described above, and an object thereof is to increase the transmittance of light used in an electronic component in a display region of a display device and reduce damage from a first electrode at the time of manufacturing of the display device.

Solution to Problem

The technique of the disclosure relates to a display device including a substrate, a thin film transistor (hereinafter will be referred to as "TFT") layer provided on the substrate and including a plurality of TFTs, and a light-emitting element layer provided on the TFT layer and including a plurality of light-emitting elements. In the display device, a display region that displays an image by light emission from the light-emitting elements controlled by an action of the TFTs is provided, and an electronic component is disposed on a back face side of the display region with respect to the substrate and is configured to use light transmitted through the light-emitting element layer, the TFT layer, and the substrate.

In a display device according to the technique of the disclosure, a display region includes a first display region and a second display region that is positioned inside of the first display region and transmits the light used in an electronic component. A plurality of light-emitting elements include a first light-emitting element positioned in the first display region and a second light-emitting element positioned in the second display region. Each of the first light-emitting element and the second light-emitting element has a first electrode provided for each light-emitting element, a light-emitting function layer provided on the first electrode, and a second electrode provided on the light-emitting function layer. The first electrode of the first light-emitting element includes a first reflective conductive layer having light reflectivity, and a first upper transparent conductive layer provided on the first reflective conductive layer and having light transmittance. The first electrode of the second light-emitting element includes a second transparent conductive layer having light transmittance. The second transparent conductive layer is crystallized and thicker than the first upper transparent conductive layer.

Advantageous Effects of Disclosure

According to a display device according to the technique of the disclosure, a first electrode of a second light-emitting element includes a second transparent conductive layer that is thicker than a first upper transparent conductive layer included in a first electrode of a first light-emitting element, and thus the first electrode of the second light-emitting element can be constituted by the second transparent conductive layer or can be configured to include a reflective conductive layer thinner than the second reflective conductive layer, in addition to the second transparent conductive layer. Thereby, it is possible to increase the transmittance of light used in an electronic component in a display region. In addition, since the second transparent conductive layer is easily crystallized, by forming the first electrode of the second light-emitting element, crystallizing the second transparent conductive layer included in the first electrode, and then forming the first electrode of the first light-emitting element in the manufacture of the display device, it is possible to prevent an etching solution for patterning the first electrode of the first light-emitting element from infiltrating into the first electrode of the second light-emitting element and to reduce damage to the first electrode of the second light-emitting element.

DESCRIPTION OF EMBODIMENTS

Figure 1:
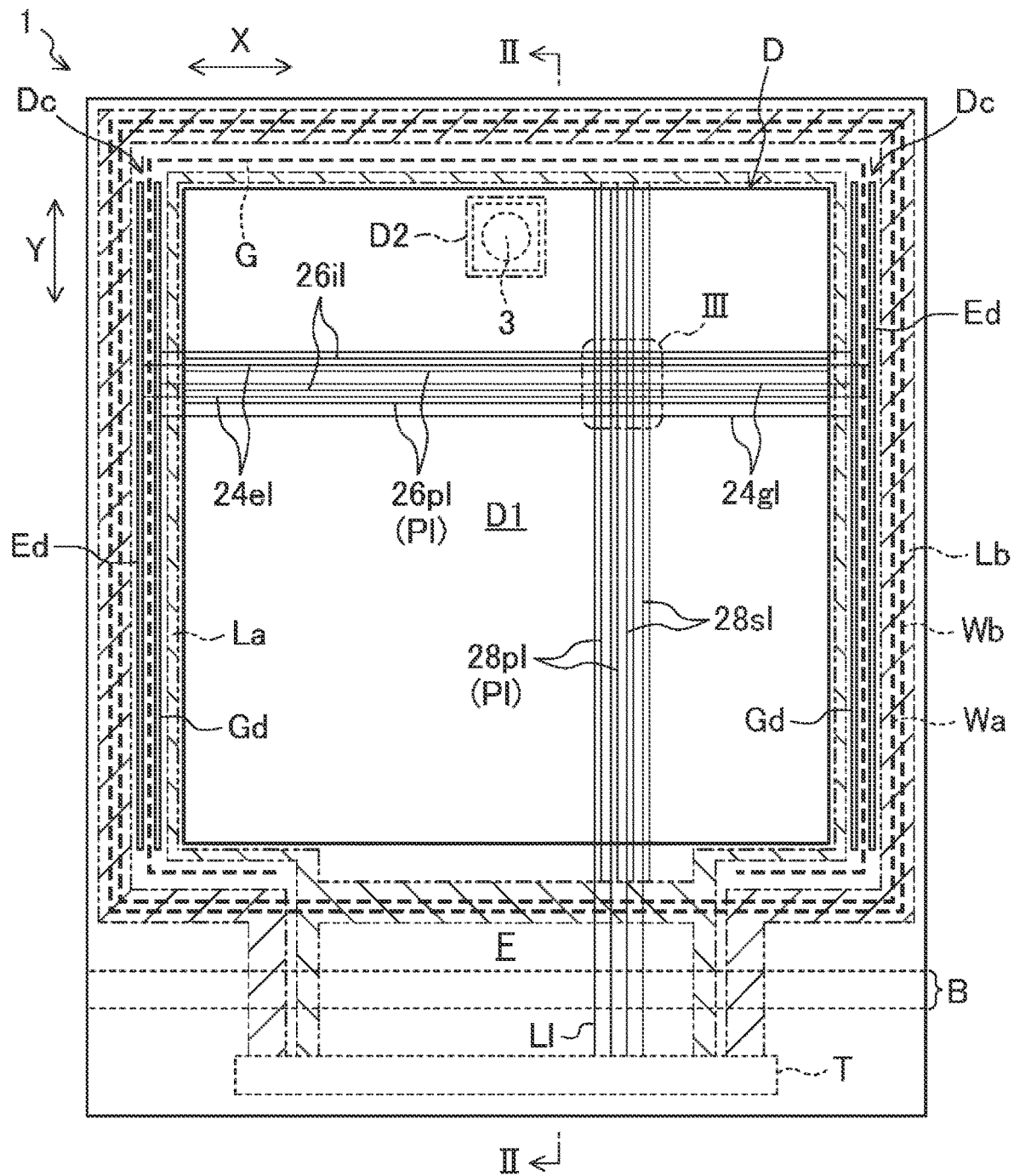
FIG. 1 is a plan view illustrating a schematic configuration of an organic EL display device according to a first embodiment.

Exemplary embodiments will be described below in detail with reference to the drawings. In the following embodiments, an organic EL display device including organic EL elements will be described as an example of a display device according to the technique of the disclosure.

Note that, in the following embodiments, a description stating that a constituent element such as a film, layer, element, or the like is provided or formed on another constituent element such as another film, layer, element, or the like means not only a case in which a constituent element is provided directly on another constituent element, but also a case in which still another constituent element such as still another film, layer, element, or the like is interposed between the constituent element and the other constituent element.

Further, in the following embodiments, a description stating that a constituent element such as a film, layer, element, or the like is connected to another constituent element such as another film, layer, element, or the like means that the constituent element and the other constituent element are electrically connected to each other unless otherwise stated. This description means, without departing from the gist of the technique of the disclosure, not only a case in which a constituent element is directly connected to another constituent element, but also a case in which a constituent element and another constituent element are indirectly connected to each other with still another constituent element such as still another film, layer, element, or the like interposed therebetween. This description also includes a case in which a constituent element is integrated with another constituent element, namely, a part of a constituent element constitutes another constituent element.

Further, in the following embodiments, a description stating that a constituent element such as a film, layer, element, or the like is in the same layer as another constituent element such as another film, layer, element, or the like means that the constituent element and the other constituent element are formed by the same process. A description stating that a constituent element such as a film, layer, element, or the like is in a layer below another constituent element such as another film, layer, element, or the like means that the constituent element is formed by an earlier process than that of the other constituent element. A description stating that a constituent element such as a film, layer, element, or the like is in a layer above another constituent element such as another film, layer, element, or the like means that the constituent element is formed by a later process than that of the other constituent element.

Further, in the following embodiments, a description stating that a constituent element such as a film, layer, element, or the like is identical or equivalent to another constituent element such as another film, layer, element, or the like means not only a state in which the constituent element and the other constituent element are completely identical or completely equivalent to each other, but also a state in which the constituent element and the other constituent element are substantially identical or substantially equivalent to each other within a range in which they vary due to manufacturing variations or tolerable errors.

Further, in the following embodiments, the terms "first", "second", "third" . . . are used to distinguish the objects to which those terms are attached, and do not limit the number of objects or the order of the objects in any way.

First Embodiment

Figure 2:
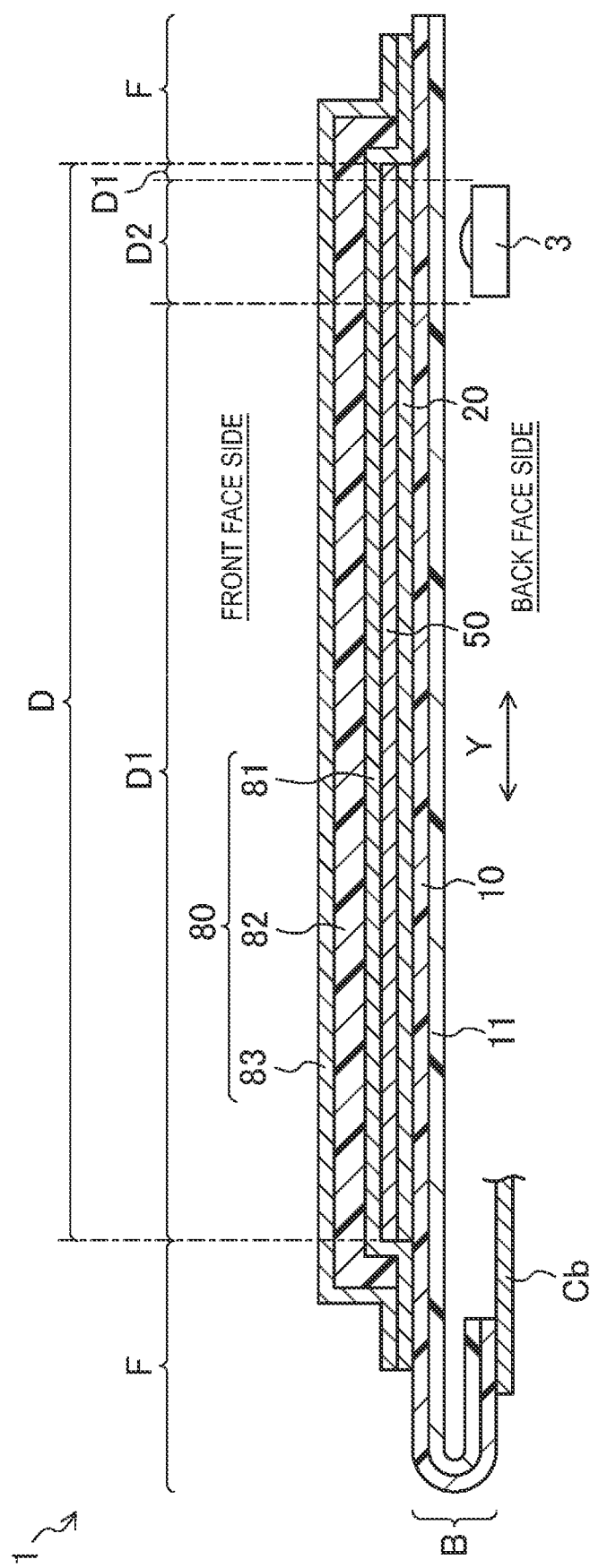
FIG. 2 is a cross-sectional view of the organic EL display device in a part along line II-II in FIG. 1.
Figure 3:
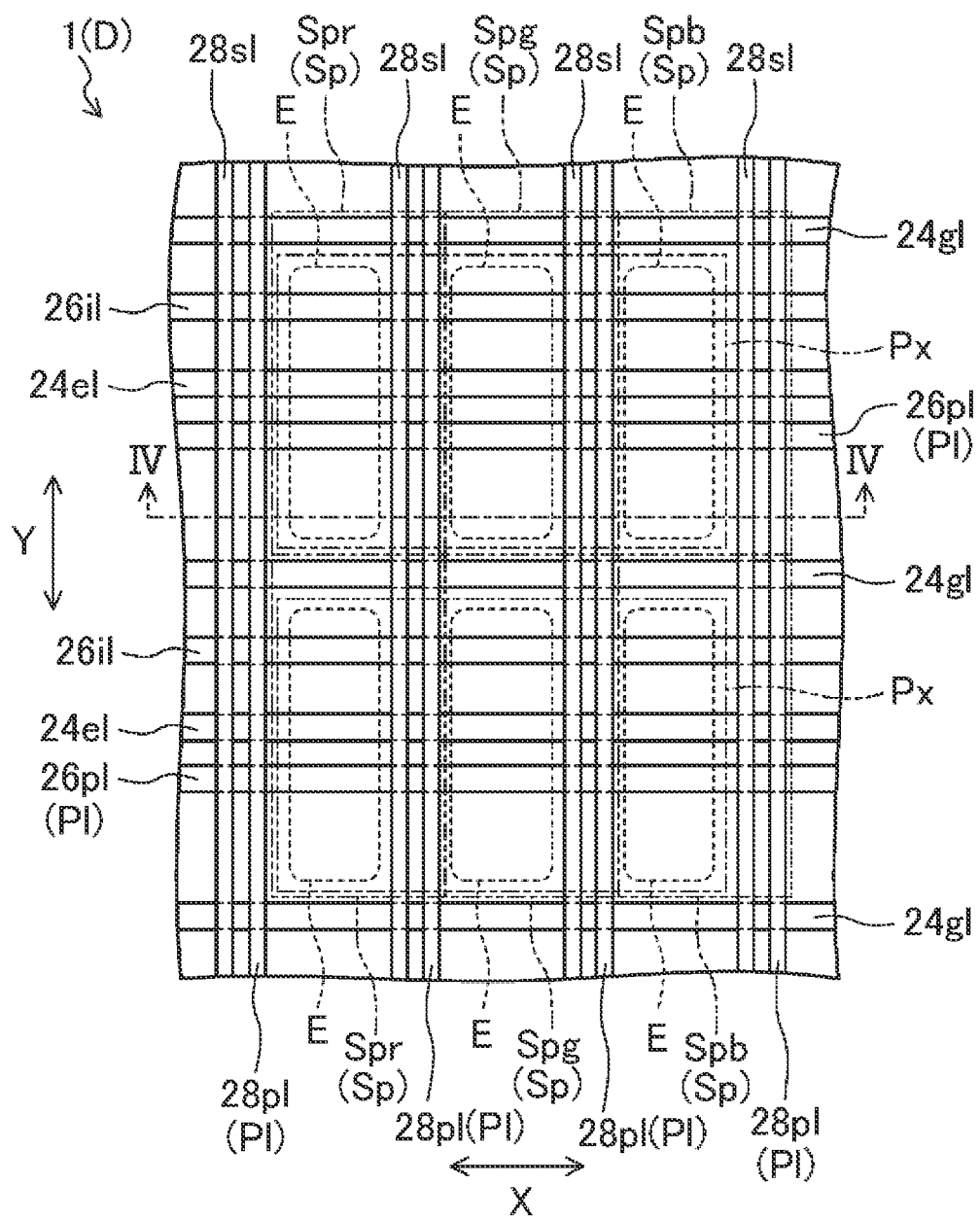
FIG. 3 is a plan view illustrating a display region of the organic EL display device surrounded by a line III in FIG. 1.
Figure 4:
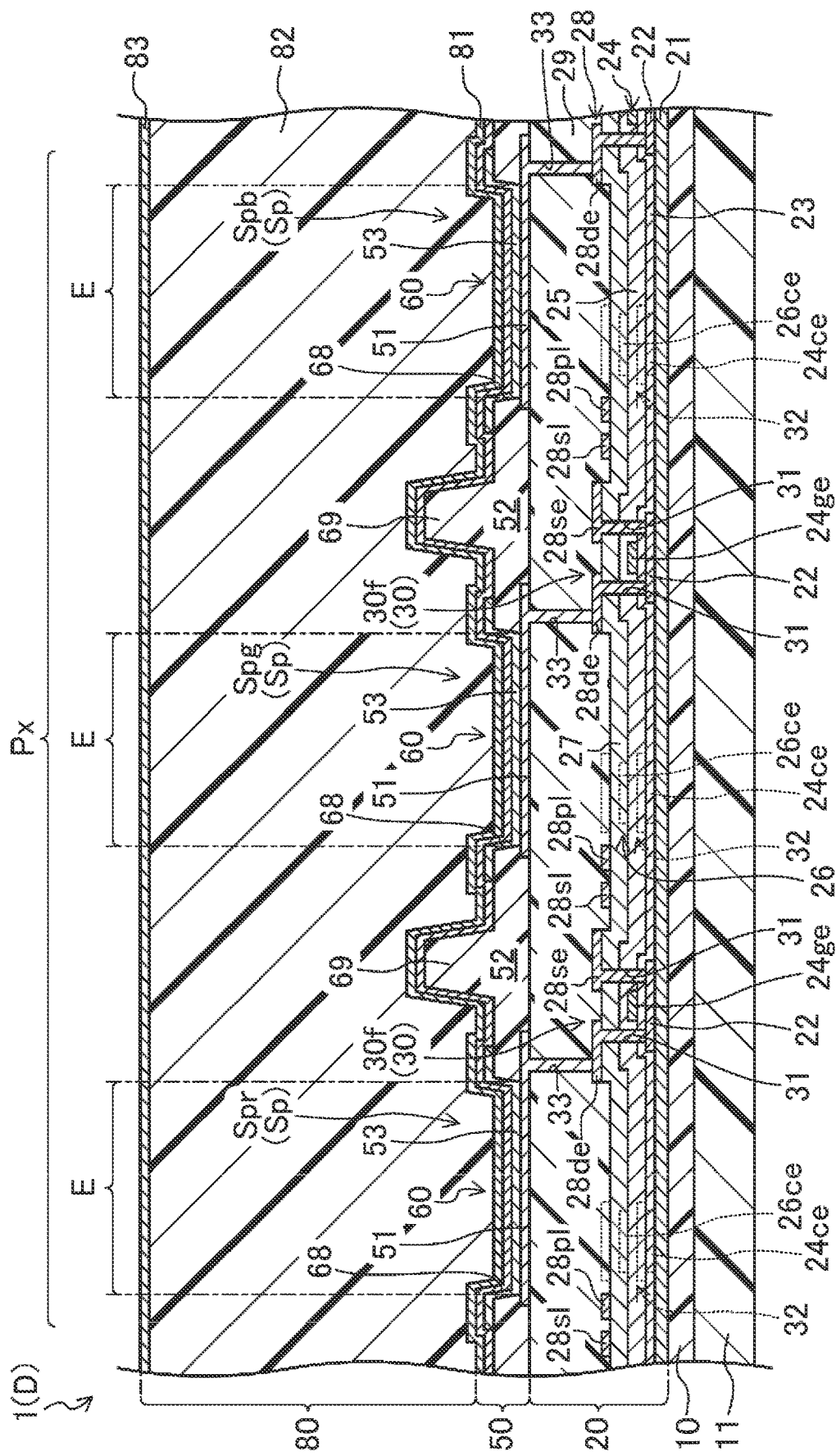
FIG. 4 is a cross-sectional view of the organic EL display device in a part along line IV-IV in FIG. 3.
Figure 5:
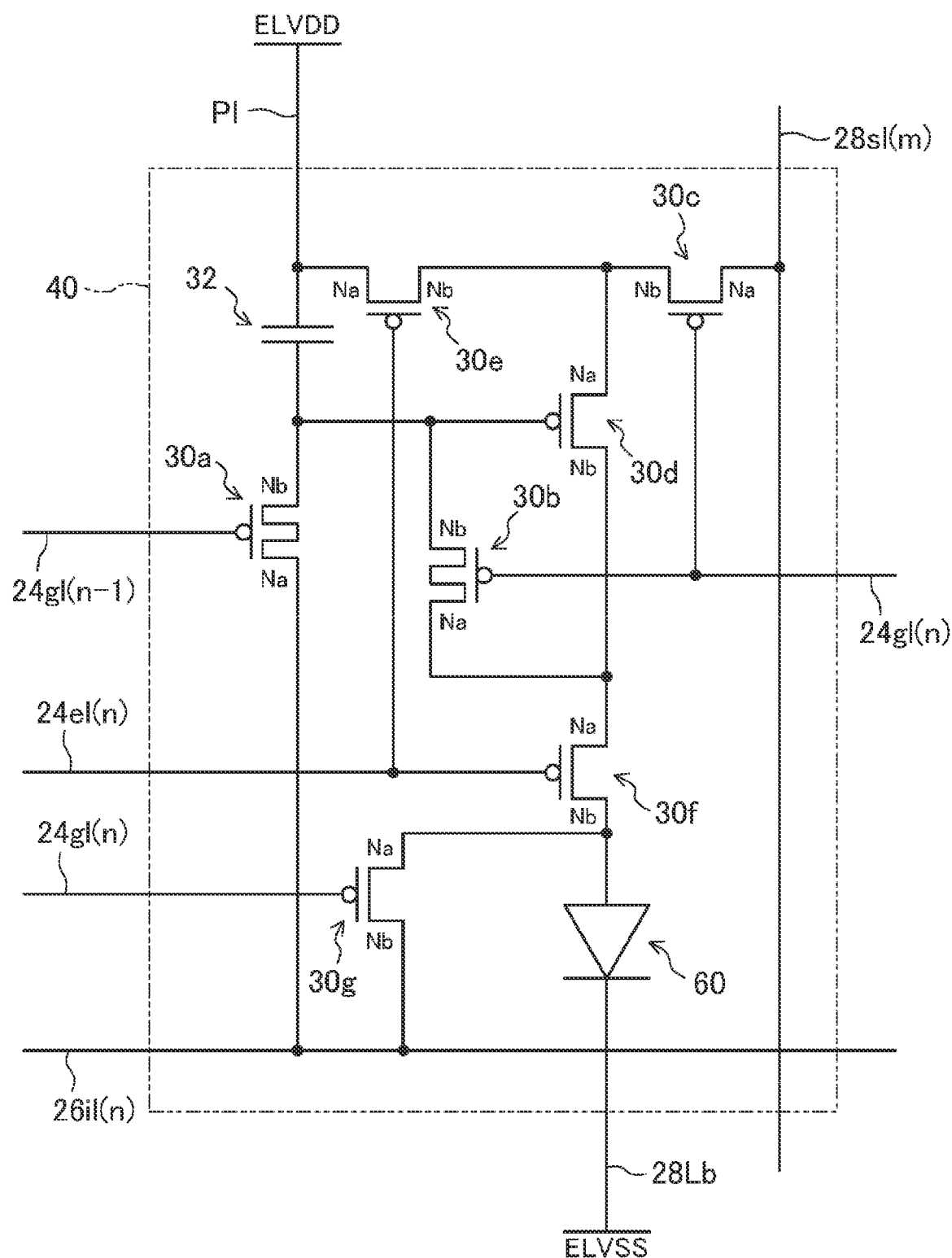
FIG. 5 is an equivalent circuit diagram illustrating a pixel circuit of the organic EL display device according to the first embodiment.

FIG. 1 to FIG. 5 illustrate an example of an organic EL display device 1 according to the technique of the disclosure. FIG. 1 is a plan view illustrating a schematic configuration of the organic EL display device 1 according to a first embodiment. FIG. 2 is a cross-sectional view of the organic EL display device 1 in a part along line II-II in FIG. 1. FIG. 3 is a plan view illustrating a display region D of the organic EL display device 1 surrounded by a line III in FIG. 1. FIG. 4 is a cross-sectional view of the organic EL display device 1 in a part along line IV-IV in FIG. 3. FIG. 5 is an equivalent circuit diagram illustrating a pixel circuit 40.

Configuration of Organic EL Display Device

As illustrated in FIG. 1 and FIG. 2, the organic EL display device 1 constitutes a display device, provided with an in-camera, which is combined with a camera 3 that captures an image of the front face side on which an image is displayed. The organic EL display device 1 includes the display region D that displays an image, and a frame region F provided in the periphery of the display region D. The camera 3 is disposed on the back face side of the display region D with respect to a resin substrate layer 10 of the organic EL display device 1, and is provided at a position overlapping the display region D in a plan view.

The camera 3 is an electronic component that uses light for image capture transmitted through a light-emitting element layer 50, a TFT layer 20, and the resin substrate layer 10, which will be described below, from the front face side of the organic EL display device 1 on which an image is displayed. For example, the camera 3 includes an image sensor such as a charge coupled device (CCD), a complementary metal oxide semiconductor (CMOS), or the like. The camera 3 is installed inside a housing (not illustrated) that houses the organic EL display device 1.

The display region D is a rectangular region constituting a screen. Note that, in the present embodiment, although the display region D having a rectangular shape is illustrated as an example, the display region D may have a substantially rectangular shape such as a shape whose sides are arc-shaped, a shape whose corners are arc-shaped, a shape in which a part of a side has a notch, or the like. As illustrated in FIG. 3, the display region D includes a plurality of pixels Px.

The plurality of pixels Px are arrayed in a matrix. Each of the pixels Px is constituted by three subpixels Sp. The three subpixels Sp are a subpixel Spr including a light-emitting region E that emits red light, a subpixel Spg including the light-emitting region E that emits green light, and a subpixel Spb including the light-emitting region E that emits blue light. These three subpixels Spr, Spg, and Spb are arrayed in a stripe shape, for example.

As illustrated in FIG. 1 and FIG. 2, the display region D includes a first display region D1 and a second display region D2. The first display region D1 is a region that occupies a large portion of the display region D. The second display region D2 is located inside the first display region D1. The second display region D2 is a region including a portion of the display region D that transmits light used for image capture by the camera 3. The second display region D2 is provided in a rectangular island-shape on the upper side of the display region D, for example, and is surrounded by the first display region D1. The second display region D2 may have the substantially rectangular shape as described above, or may have another shape such as a circular shape or an elliptical shape.

The frame region F is a region having a rectangular frame shape and constituting a non-display portion other than the screen. A terminal portion T to be connected to an external circuit is provided in a portion constituting one side of the frame region F. A bending portion B that is bendable with a first direction X, which is the horizontal direction in FIG. 1, as the bending axis is provided between the display region D and the terminal portion T in the frame region F.

The terminal portion T is disposed on the back face side of the organic EL display device 1 by the frame region F being bent, for example, by 180 degrees (in a U shape) at a bending portion B. The terminal portion T is connected to a wiring line substrate Cb such as a flexible printed circuit (FPC). A plurality of lead-out wiring lines L1 drawn from the display region D to the terminal portion T are provided in the frame region F. The plurality of lead-out wiring lines L1 are connected to a display control circuit (not illustrated) via the wiring line substrate Cb at the terminal portion T.

In the frame region F, in a flattening film 29 to be described below, a trench G is provided so as to surround the display region D. The trench G extends in a substantially C-shape in a plan view, and is open on the terminal portion T side. The trench G penetrates the flattening film 29, and divides the flattening film 29 into an inner side and an outer side of the frame region F. The trench G plays a role of preventing infiltration of moisture or the like into the display region D. The trench G may be provided over the entire periphery of the display region D.

In the frame region F, a drive circuit Dc including a gate driver Gd and an emission driver Ed is monolithically provided in a portion constituting sides adjacent to the side at which the terminal portion T is provided (both left and right sides in FIG. 1). The gate driver Gd is disposed further to the display region D side than the trench G. The emission driver Ed is disposed further to the outer peripheral side of the frame region F than the trench G. The arrangement of the gate driver Gd and the emission driver Ed with respect to the trench G may be reversed.

The frame region F is provided with a first frame wiring line La and a second frame wiring line Lb. The first frame wiring line La is provided in a frame shape further to the display region D side than the trench G and the drive circuit Dc. The first frame wiring line La extends to the terminal portion T through the open portion of the trench G in the frame region F. A high-level power supply voltage (ELVDD) is input to the first frame wiring line La via the wiring line substrate Cb at the terminal portion T. The second frame wiring line Lb is provided in a substantially C-shape further to the outer peripheral side of the frame region F than the trench G and the drive circuit Dc. Both end portions of the second frame wiring line Lb extend to the terminal portion T along the first frame wiring line La. A low-level power supply voltage (ELVSS) is input to the second frame wiring line Lb via the wiring line substrate Cb at the terminal portion T.

A first dam wall Wa and a second dam wall Wb are provided in the frame region F. The first dam wall Wa is provided in a frame shape on the outer side of the trench G. The second dam wall Wb is provided in a frame shape at the outer periphery of the first dam wall Wa. When applying an organic material that forms an organic sealing layer 82 constituting a sealing film 80 during a manufacturing process of the organic EL display device 1, the first dam wall Wa and the second dam wall Wb play a role of holding back an expansion of the organic material to the outer side of the frame region F. Although not illustrated, the first dam wall Wa and the second dam wall Wb are each constituted by a first wall layer and a second wall layer provided on the first wall layer, for example.

The organic EL display device 1 adopts an active matrix driving method in which light emission from each of the subpixels Sp is controlled by a TFT 30 and an image is displayed by the action of the TFT 30. As illustrated in FIG. 2 and FIG. 4, the organic EL display device 1 includes the resin substrate layer 10, the TFT layer 20 provided on the resin substrate layer 10, the light-emitting element layer 50 provided on the TFT layer 20, and the sealing film 80 provided so as to cover the light-emitting element layer 50.

Resin Substrate Layer

The resin substrate layer 10 is an example of a substrate forming a base. The resin substrate layer 10 is formed, for example, of an organic material such as a polyimide resin, a polyamide resin, or an epoxy resin. The resin substrate layer has flexibility. The resin substrate layer 10 may be constituted by a layered film formed by an inorganic insulating layer made of an inorganic material such as silicon oxide, silicon nitride, silicon oxynitride, and a resin layer made of the above-described organic material. A rear surface protection film 11 is bonded to the back face of the resin substrate layer 10.

TFT Layer

The TFT layer 20 includes a base coat film 21, a semiconductor layer 22, a gate insulating film 23, a first conductive layer 24, a first interlayer insulating film 25, a second conductive layer 26, a second interlayer insulating film 27, a third conductive layer 28, the flattening film 29 and the first wall layer which are provided in order on the resin substrate layer 10.

The first conductive layer 24 is provided on the gate insulating film 23. The first conductive layer 24 includes a plurality of gate wiring lines 24gl, a plurality of gate electrodes 24ge, a plurality of emission control wiring lines 24el, a plurality of first capacitance electrodes 24ce, and a plurality of first lead-out wiring lines. The gate wiring lines 24gl, the gate electrodes 24ge, the emission control wiring lines 24el, the first capacitance electrodes 24ce, and the first lead-out wiring lines are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material and in the same layer.

The second conductive layer 26 is provided on the first interlayer insulating film 25. The second conductive layer 26 includes a plurality of initialization power source wiring lines 26il, a plurality of first power source wiring lines 26pl, and a plurality of second capacitance electrodes 26ce. The initialization power source wiring lines 26il, the first power source wiring lines 26*pl*, and the second capacitance electrodes 26*ce* are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material and in the same layer.

The third conductive layer 28 is provided on the second interlayer insulating film 27. The third conductive layer 28 includes a plurality of source wiring lines 28*sl*, a plurality of source electrodes 28*se*, a plurality of drain electrodes 28*de*, a plurality of second power source wiring lines 28*pl*, a plurality of second lead-out wiring lines, a first frame wiring line 28La, and the second frame wiring line Lb. The source wiring lines 28*sl*, the source electrodes 28*se*, the drain electrodes 28*de*, the second power source wiring lines 28*pl*, the second lead-out wiring lines, the first frame wiring line 28La, and the second frame wiring line Lb are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material and in the same layer.

As illustrated in FIG. 3, the plurality of gate wiring lines 24*gl* are provided in the display region D and extend parallel to each other in a first direction X. The gate wiring line 24*gl* is a wiring line that transmits a gate signal and is provided for each row of the subpixels Sp. Each of the gate wiring lines 24*gl* is connected to the gate driver Gd, selected at a predetermined timing, and brought into an active state.

The plurality of emission control wiring lines 24*el* are provided in the display region D and extend parallel to each other in the first direction X. The emission control wiring line 24*el* is a wiring line that transmits an emission control signal and is provided for each row of the subpixels Sp. The emission control wiring lines 24*el* are connected to the emission driver Ed, selected at a predetermined timing in order, and brought into an inactive state.

The plurality of first lead-out wiring lines are provided in the frame region F and extend parallel to each other in a second direction Y, which is the vertical direction in FIG. 1 orthogonal to the first direction X. The first lead-out wiring lines constitute a portion of the lead-out wiring line L1.

The plurality of initialization power source wiring lines 26*il* are provided in the display region D and extend parallel to each other in the first direction X. The initialization power source wiring line 26*il* is a wiring line that imparts an initialization potential and is provided for each row of the subpixels Sp.

The plurality of first power source wiring lines 26*pl* are provided in the display region D and extend parallel to each other in the first direction X. The first power source wiring line 26*pl* is a wiring line that imparts a predetermined high-level potential and is provided for each row of the subpixels Sp. Each of the first power source wiring lines 26*pl* is connected to the first frame wiring line La via a contact hole formed in the second interlayer insulating film 27.

The plurality of source wiring lines 28*sl* are provided in the display region D and extend parallel to each other in the second direction Y. The source wiring line 28*sl* is a wiring line that transmits a source signal and is provided for each column of the subpixels Sp. Each of the source wiring lines 28*sl* is connected to the lead-out wiring line L1, and is connected to the display control circuit via the lead-out wiring line L1.

The plurality of second power source wiring lines 28*pl* are provided in the display region D and extend parallel to each other in the second direction Y. The second power source wiring line 28*pl* is a wiring line that imparts a predetermined high-level potential and is provided for each column of the subpixels Sp. Each of the second power source wiring lines 28*pl* is connected to the first frame wiring line La.

Each of the second power source wiring lines 28*pl* intersects with each of the first power source wiring lines 26*pl*. Each of the second power source wiring lines 28*pl* is connected to the first power source wiring line 26*pl* at an intersection therebetween, via a contact hole formed in the second interlayer insulating film 27. The plurality of second power source wiring lines 28*pl* constitute a high-level power source wiring line Pl together with the plurality of first power source wiring lines 26*pl*.

The plurality of second lead-out wiring lines are provided in the frame region F and extend parallel to each other in the second direction Y. The second lead-out wiring lines are connected to the first lead-out wiring lines and constitute the lead-out wiring lines L1 together with the first lead-out wiring lines.

As illustrated in FIG. 4, the semiconductor layer 22, the gate insulating film 23, the gate electrode 24*ge*, the first interlayer insulating film 25, the second interlayer insulating film 27, and the source electrode 28*se* and the drain electrode 28*de* constitute a top-gate type TFT 30.

The semiconductor layer 22 is provided in an island shape. The semiconductor layer 22 is formed of a low temperature polycrystalline silicon (LTPS), an oxide semiconductor such as an indium gallium zinc oxide (In—Ga—Zn—O based), or the like, for example.

The gate insulating film 23 is provided so as to cover the semiconductor layer 22. The gate insulating film 23 is formed of a single-layer film or a layered film formed by an inorganic insulating layer of, for example, silicon oxide, silicon nitride, silicon oxynitride, or the like. The gate electrode 24*ge* is provided at a position overlapping a part (channel region) of the semiconductor layer 22 via the gate insulating film 23.

The first interlayer insulating film 25 is provided so as to cover the gate wiring lines 24*gl*, the gate electrodes 24*ge*, the emission control wiring lines 24*el*, and the first capacitance electrodes 24*ce*. The second interlayer insulating film 27 is provided on the first interlayer insulating film 25 so as to cover the initialization power source wiring lines 26*il*, the first power source wiring lines 26*pl*, and the second capacitance electrodes 26*ce*. Each of the first interlayer insulating film 25 and the second interlayer insulating film 27 is formed of a single-layer film or a layered film formed by an inorganic insulating layer of, for example, silicon oxide, silicon nitride, silicon oxynitride, or the like.

The source electrode 28*se* and the drain electrode 28*de* are separated from each other. The source electrode 28*se* and the drain electrode 28*de* are connected to different portions (source region and drain region) at positions in the semiconductor layer 22, which sandwich a region overlapping the gate electrode 24*ge*, through a contact hole 31 formed in the gate insulating film 23, the first interlayer insulating film 25, and the second interlayer insulating film 27.

A plurality of the TFTs 30 are provided for each of the subpixels Sp. In other words, the TFT layer 20 includes the plurality of TFTs 30.

As illustrated in FIG. 5, the plurality of TFTs 30 provided for each subpixel Sp include a first TFT 30*a*, a second TFT 30*b*, a third TFT 30*c*, a fourth TFT 30*d*, a fifth TFT 30*e*, a sixth TFT 30*f*, and a seventh TFT 30*g*. The first TFT 30*a*, the second TFT 30*b*, the third TFT 30*c*, the fourth TFT 30*d*, the fifth TFT 30e, the sixth TFT 30f, and the seventh TFT 30g are all, for example, P-channel type TFTs.

The first capacitance electrodes 24ce, the first interlayer insulating film 25, and the second capacitance electrodes 26ce constitute a capacitor 32. At least one of the capacitors 32 is provided for each of the subpixels Sp.

The first capacitance electrode 24ce is connected to three of the TFTs 30 (a first TFT 30a, a second TFT 30b, and a fourth TFT 30d), of the plurality of TFTs 30 provided for each of the subpixels Sp. The second capacitance electrode 26ce is provided at a position overlapping the first capacitance electrode 24ce via the first interlayer insulating film 25. The second capacitance electrode 26ce is connected to the high-level power source wiring line Pl.

The first TFT 30a, the second TFT 30b, the third TFT 30c, the fourth TFT 30d, the fifth TFT 30e, the sixth TFT 30f, the seventh TFT 30g, and the capacitor 32 constitute a pixel circuit 40 as illustrated in FIG. 5. The pixel circuit 40 controls light emission in the light-emitting region E of the corresponding subpixel Sp based on the gate signal supplied from the gate wiring line 24gl, the emission signal supplied from the emission control wiring line 24el, the source signal supplied from the source wiring line 28sl, the initialization potential applied to the initialization power source wiring line 26il, and the high-level potential supplied from the high-level power source wiring line Pl.

The pixel circuit 40 illustrated in FIG. 5 is the pixel circuit 40 of the subpixel Sp in the m-th row and n-th column (m and n are positive integers). In FIG. 5, the source wiring line 28sl, to which (m) is added to the reference numeral thereof, is the source wiring line 28sl corresponding to the subpixels Sp in the m-th row. The gate wiring line 24gl and the emission control wiring line 24el, to which (n) is added to the reference numerals thereof, are the gate wiring line 24gl and the emission control wiring line 24el corresponding to the subpixels Sp in the n-th column. Further, the gate wiring line 24gl, to which (n-1) is added to the reference numeral thereof, is the gate wiring line 24gl that is scanned immediately before the gate wiring line 24gl in the n-th column.

In the first TFT 30a, the second TFT 30b, the third TFT 30c, the fourth TFT 30d, the fifth TFT 30e, the sixth TFT 30f, and the seventh TFT 30g, the gate electrode 24ge corresponds to a control terminal, one electrode of the source electrode 28se and the drain electrode 28de corresponds to a first conduction terminal Na, and the other electrode corresponds to a second conduction terminal Nb.

The first TFT 30a is a first initialization TFT provided between the gate wiring line 24gl (n-1), the initialization power source wiring line 26il, and the capacitor 32. A control terminal of the first TFT 30a is connected to the gate wiring line 24gl (n-1). The first conduction terminal Na of the first TFT 30a is connected to the initialization power source wiring line 26il. The second conduction terminal Nb of the first TFT 30a is connected to the first capacitance electrode 24ce of the capacitor 32. This first TFT 30a initializes a voltage applied to a control terminal of the fourth TFT 30d by applying a voltage of the initialization power source wiring line 26il to the capacitor 32 in response to the selection of the gate wiring line 24gl (n-1).

The second TFT 30b is a threshold voltage compensation TFT provided between the gate wiring line 24gl (n) and the fourth TFT 30d. A control terminal of the second TFT 30b is connected to the gate wiring line 24gl. The first conduction terminal Na of the second TFT 30b is connected to the second conduction terminal Nb of the fourth TFT 30d. The second conduction terminal Nb of the second TFT 30b is connected to the control terminal of the fourth TFT 30d. This second TFT 30b causes the fourth TFT 30d to be in a diode-connected state in response to the selection of the gate wiring line 24gl (n), and compensates for a threshold voltage of the fourth TFT 30d.

The third TFT 30c is a writing control TFT provided between the gate wiring line 24gl (n), the source wiring line 28sl (m), and the fourth TFT 30d. A control terminal of the third TFT 30c is connected to the gate wiring line 24gl (n). The first conduction terminal Na of the third TFT 30c is connected to the source wiring line 28sl (m). The second conduction terminal Nb of the third TFT 30c is connected to the first conduction terminal Na of the fourth TFT 30d. This third TFT 30c applies a voltage of the source wiring line 28sl (m) to the first conduction terminal Na of the fourth TFT 30d in response to the selection of the gate wiring line 24gl.

The fourth TFT 30d is a driving TFT provided between the first TFT 30a, the second TFT 30b, the capacitor 32, the third TFT 30c, the fifth TFT 30e, and the sixth TFT 30f. The control terminal of the fourth TFT 30d is connected to the second conduction terminal Nb of the second TFT 30b and the second conduction terminal Nb of the first TFT 30a. The first conduction terminal Na of the fourth TFT 30d is connected to the second conduction terminal Nb of the third TFT 30c and the second conduction terminal Nb of the fifth TFT 30e. The second conduction terminal Nb of the fourth TFT 30d is connected to the first conduction terminal Na of the second TFT 30b and the first conduction terminal Na of the sixth TFT 30f. This fourth TFT 30d applies a drive current corresponding to a voltage applied between the control terminal of its own element and the first conduction terminal Na, to the first conduction terminal Na of the sixth TFT 30f.

The fifth TFT 30e is a power supply TFT provided between an emission control wiring line 24el (n), the high-level power source wiring line Pl, and the fourth TFT 30d. A control terminal of the fifth TFT 30e is connected to the emission control wiring line 24el (n). The first conduction terminal Na of the fifth TFT 30e is connected to the high-level power source wiring line Pl. The second conduction terminal Nb of the fifth TFT 30e is connected to the first conduction terminal Na of the fourth TFT 30d. This fifth TFT 30e applies a potential of the high-level power source wiring line Pl to the first conduction terminal Na of the fourth TFT 30d in response to the selection of the emission control wiring line 24el.

The sixth TFT 30f is a light emission control TFT provided between the emission control wiring line 24el (n), the second TFT 30b, the fourth TFT 30d, and an organic EL element 60. A control terminal of the sixth TFT 30f is connected to the emission control wiring line 24el (n). The first conduction terminal Na of the sixth TFT 30f is connected to the second conduction terminal Nb of the fourth TFT 30d. The second conduction terminal Nb of the sixth TFT 30f is connected to a first electrode 51 of the organic EL element 60. This sixth TFT 30f applies a drive current to the organic EL element 60 in response to a selection of the emission control wiring line 24el (n).

The seventh TFT 30g is a second initialization TFT provided between the gate wiring line 24gl (n), the initialization power source wiring line 26il, and the organic EL element 60. A control terminal of the seventh TFT 30g is connected to the gate wiring line 24gl (n). The second conduction terminal Nb of the seventh TFT 30g is connected to the initialization power source wiring line 26il. The first conduction terminal Na of the seventh TFT 30g is connected to the first electrode 51 of the organic EL element 60. This seventh TFT 30g resets a charge accumulated in the first electrode 51 of the organic EL element 60 in response to the selection of the gate wiring line 24gl.

The capacitor 32 is a data holding element provided between the high-level power source wiring line Pl, the first TFT 30a, and the fourth TFT 30d. The first capacitance electrode 24ce of the capacitor 32 is connected to the control terminal of the fourth TFT 30d, the second conduction terminal Nb of the first TFT 30a, and the second conduction terminal Nb of the second TFT 30b. The second capacitance electrode 26ce of the capacitor 32 is connected to the high-level power source wiring line Pl. The capacitor 32 is charged at a voltage of the source wiring line 28sl when the gate wiring line 24gl is in a selected state. The capacitor 32 holds the voltage written by the charging to maintain the voltage applied to the control terminal of the fourth TFT 30d when the gate wiring line 24gl is in a non-selected state.

The flattening film 29 covers the third conductive layer 28 (the source wiring lines 28sl, the second power source wiring lines 28pl, the source electrodes 28se, and the drain electrodes 28de) except at some of the drain electrodes 28de of the sixth TFT 30f in the display region D to flatten the surface of the TFT layer 20 so as to reduce a level difference generated due to the surface shape of the first TFT 30a, the second TFT 30b, the third TFT 30c, the fourth TFT 30d, the fifth TFT 30e, the sixth TFT 30f, and the seventh TFT 30g. The flattening film 29 is formed of an organic material such as a polyimide resin.

Two of the first wall layers are provided at the outer periphery of the flattening film 29 in the frame region F. Each of the first wall layers is formed in a rectangular frame shape extending along the entire periphery of the flattening film 29. These two first wall layers have geometrically similar shapes and are spaced apart from each other in the width direction of the frame region F. Each of the first wall layers is formed of the same material as that of and in the same layer as the flattening film 29.

Light-Emitting Element Layer

Figure 6:
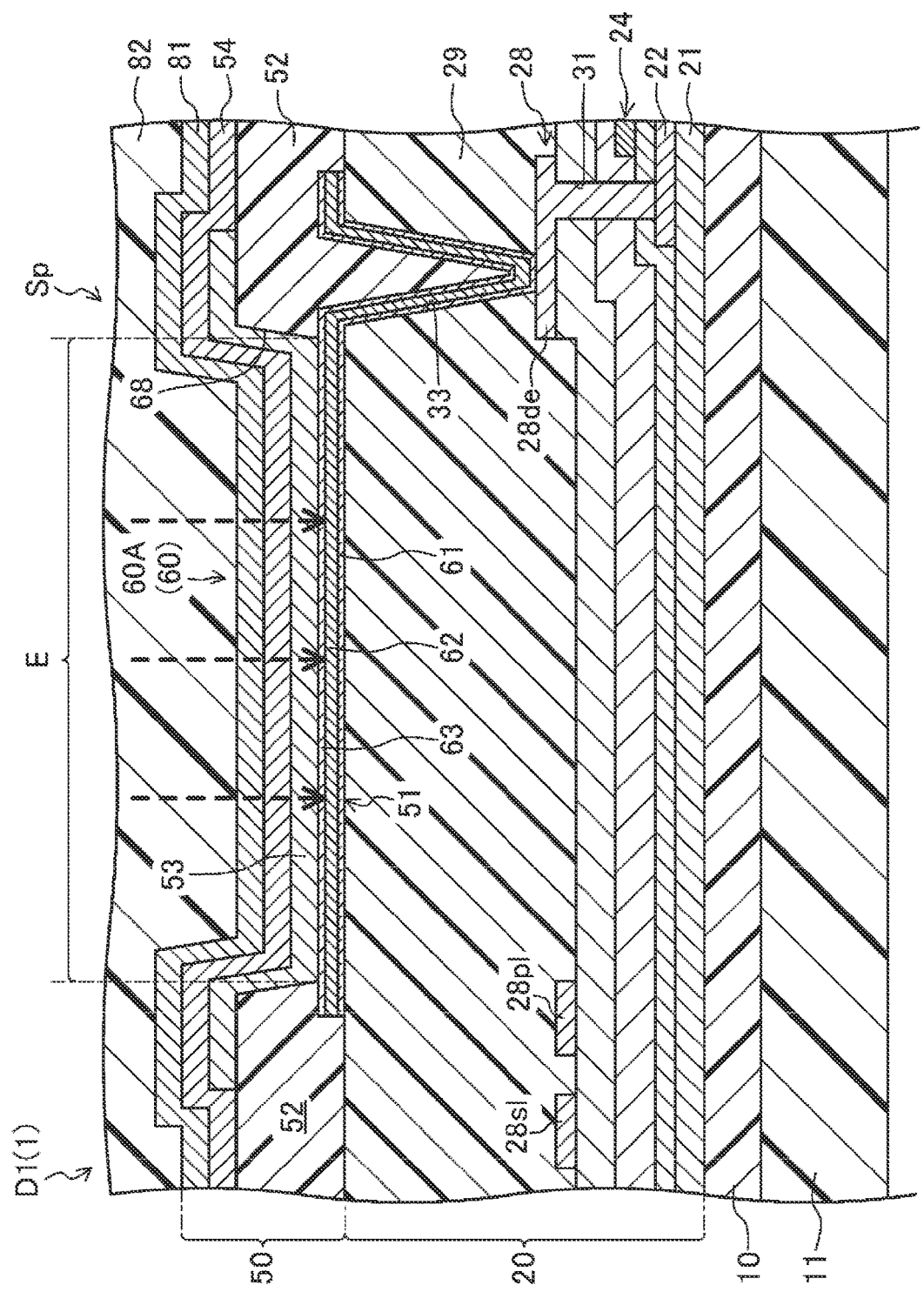
FIG. 6 is a cross-sectional view illustrating main portions in a first display region of the organic EL display device according to the first embodiment.
Figure 7:
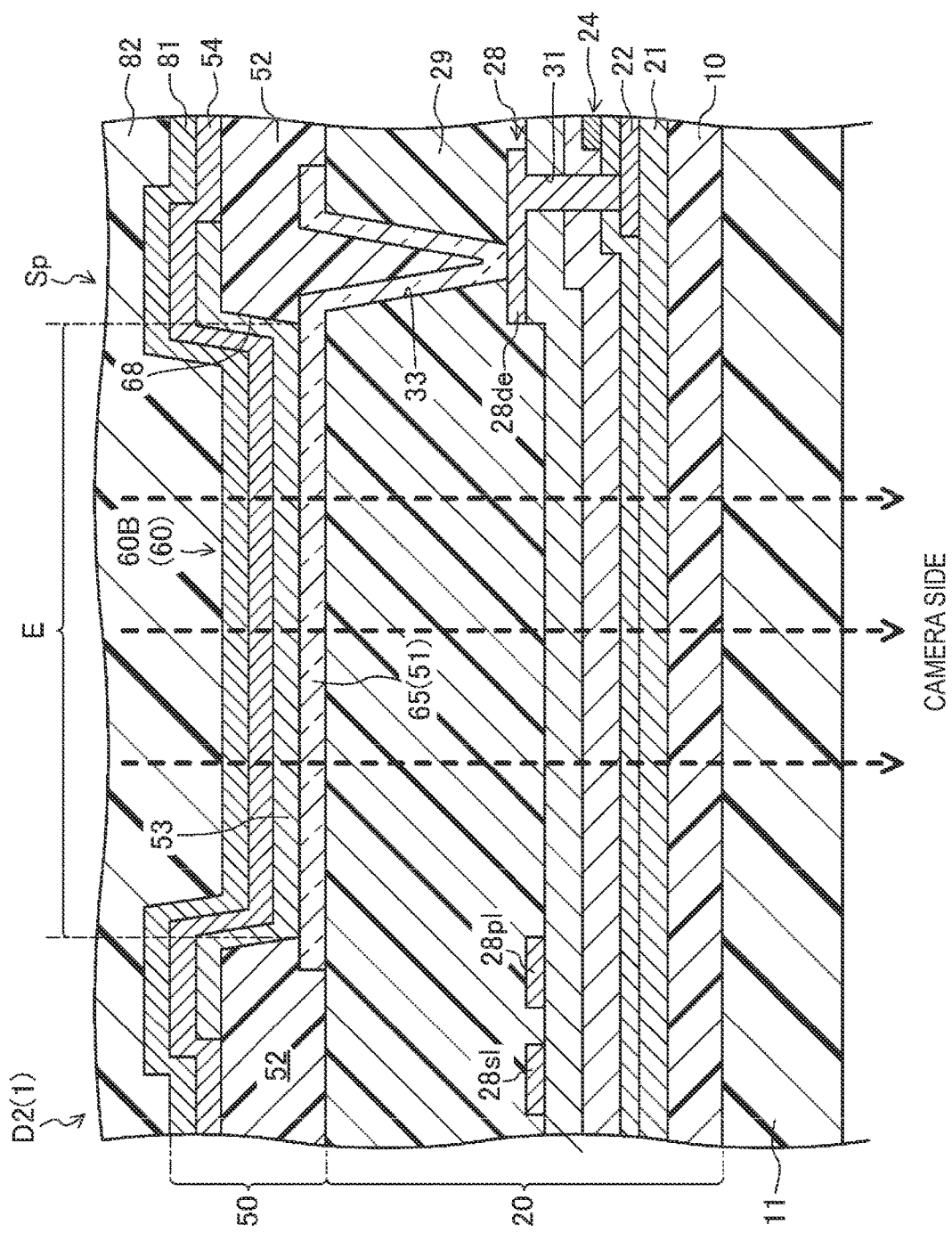
FIG. 7 is a cross-sectional view illustrating main portions in a second display region of the organic EL display device according to the first embodiment.
Figure 8:
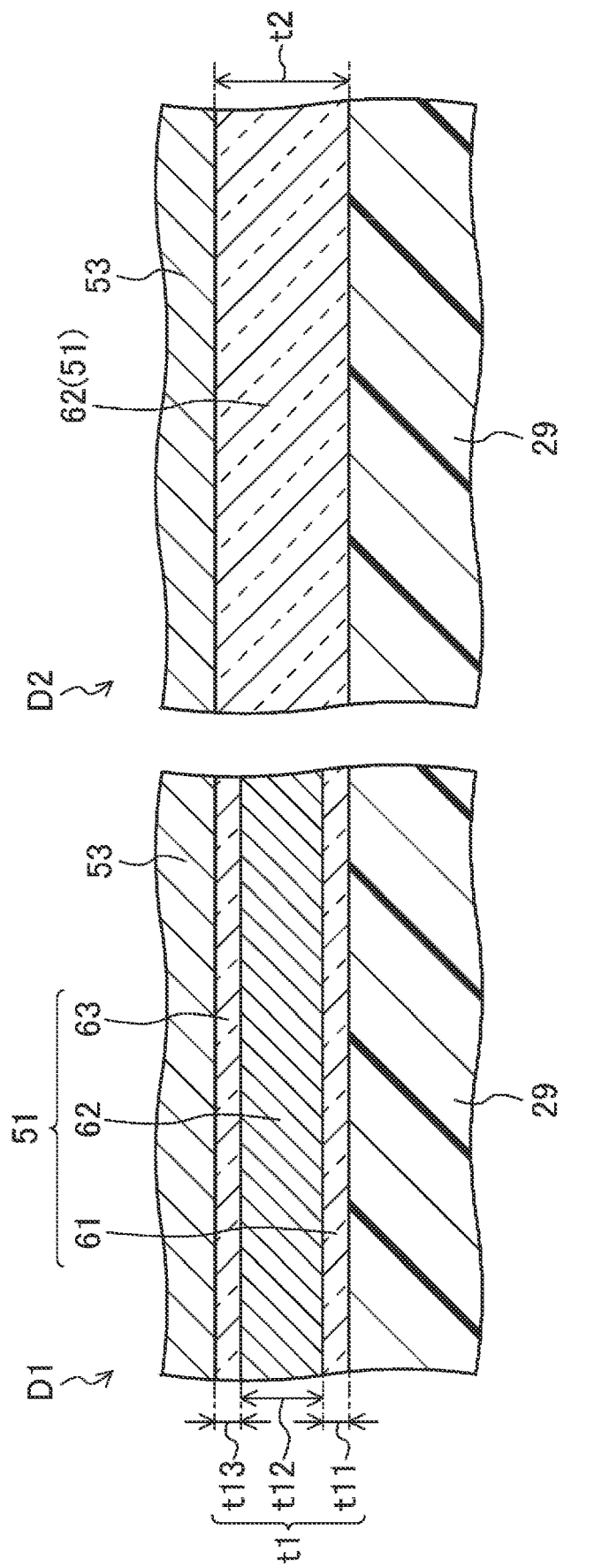
FIG. 8 is a cross-sectional view illustrating a configuration of first electrodes in the first display region and the second display region of the organic EL display device according to the first embodiment.
Figure 9:
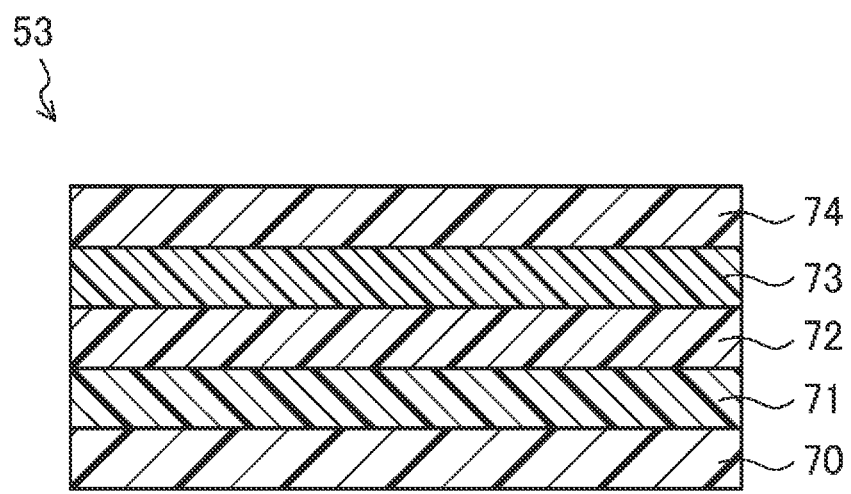
FIG. 9 is a cross-sectional view illustrating a layered structure of an organic EL layer constituting the organic EL display device according to the first embodiment.
Figure 10:
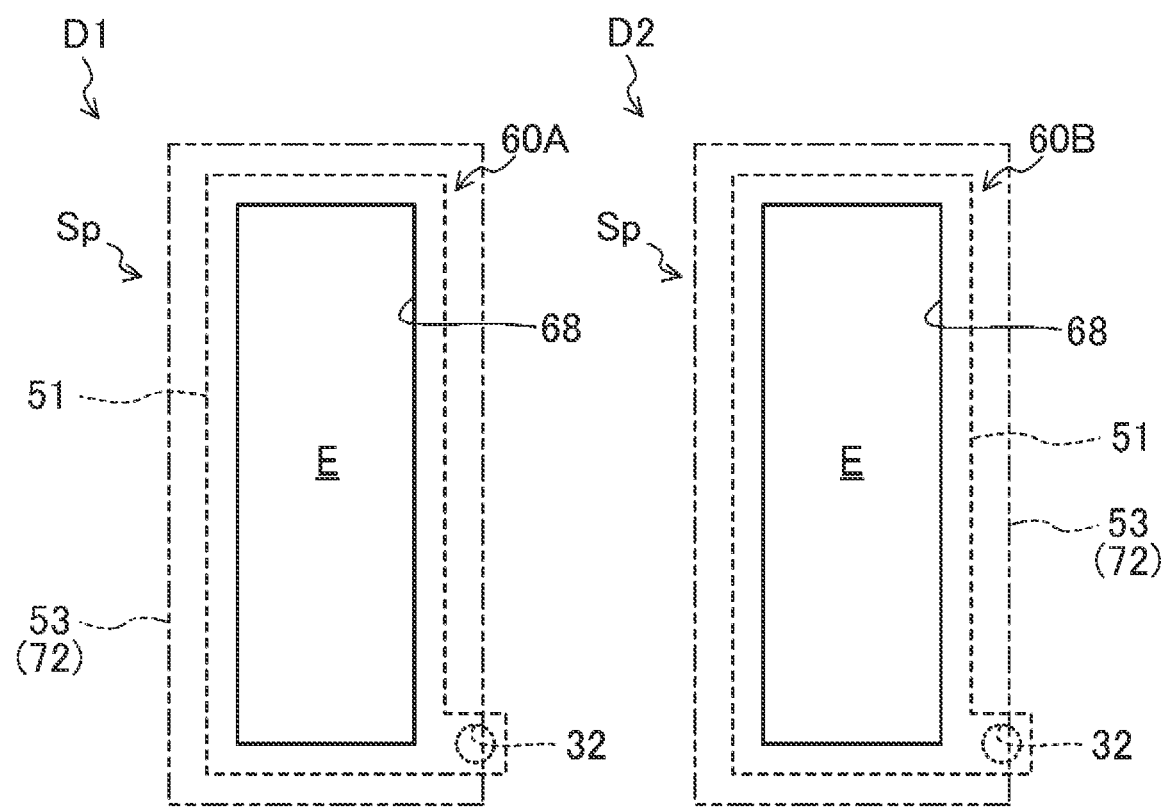
FIG. 10 is a plan view illustrating configurations of light-emitting regions and the peripheral configurations thereof in the first display region and the second display region of the organic EL display device according to the first embodiment.

FIG. 6 is a cross-sectional view illustrating main portions in the first display region D1 of the organic EL display device 1. FIG. 7 is a cross-sectional view illustrating main portions in the second display region D2 of the organic EL display device 1. FIG. 8 is a cross-sectional view illustrating configurations of the first electrodes 51 in the first display region D1 and the second display region D2 of the organic EL display device 1. FIG. 9 is a cross-sectional view illustrating a layered structure of an organic EL layer 53 constituting the organic EL display device 1. FIG. 10 is a plan view illustrating configurations of light-emitting regions E and the peripheral configurations thereof in the first display region D1 and the second display region D2.

As illustrated in FIG. 4, FIG. 6, and FIG. 7, the light-emitting element layer 50 includes the first electrode 51, an edge cover 52, the second wall layer, the organic EL layer 53, and a second electrode 54, which are provided in order on the flattening film 29.

The first electrode 51, the organic EL layer 53, and the second electrode 54 constitute the organic EL element 60. The organic EL element 60 is an example of a light-emitting element. The organic EL element 60 adopts a top-emission type structure. The organic EL element 60 is provided for each of the subpixels Sp. In other words, the light-emitting element layer 50 includes a plurality of the organic EL elements 60. The plurality of organic EL elements 60 include a plurality of first organic EL elements 60A (see FIG. 6) located in the first display region D1, and a plurality of second organic EL elements 60B (see FIG. 7) located in the second display region D2.

The first electrode 51 is provided for each of the subpixels Sp. The first electrode 51 is connected to the drain electrodes 28de of the sixth TFT 30f in the corresponding subpixel Sp via the contact hole 33 formed in the flattening film 29. The first electrode 51 functions as an anode that injects positive holes (holes) into the organic EL layer 53. The first electrode 51 is preferably formed of a material having a large work function to improve the efficiency of hole injection into the organic EL layer 53. The first electrode 51 is formed by the first organic EL element 60A and the second organic EL element 60B.

As illustrated in FIG. 6 and FIG. 8, the first electrode 51 of the first organic EL element 60A includes a first lower transparent conductive layer 61, a first reflective conductive layer 62, and a first upper transparent conductive layer 63 which are provided in order on the flattening film 29.

The first lower transparent conductive layer 61 is a layer for suppressing corrosion of the first reflective conductive layer 62 and improving the adhesion of the first electrode 51 to the flattening film 29. The first lower transparent conductive layer 61 has light transmittance to transmit light. The first lower transparent conductive layer 61 is formed of, for example, at least one transparent conductive oxide selected from among indium tin oxide (ITO) and indium zinc oxide (IZO). A thickness t11 of the first lower transparent conductive layer 61 is, for example, approximately 10 nm, which is relatively thin. The first lower transparent conductive layer 61 is crystallized. The degree of crystallization of the first lower transparent conductive layer 61 may be lower than that of a second transparent conductive layer 65 to be described below. The first lower transparent conductive layer 61 is provided in a layer below the first reflective conductive layer 62.

The first reflective conductive layer 62 has light reflectivity to reflect light. The first reflective conductive layer 62 is formed of, for example, at least one metal material selected from among silver (Ag), a silver alloy, aluminum (Al), and an aluminum alloy. A thickness t12 of the first reflective conductive layer 62 is, for example, approximately 100 nm, which is relatively thick. The first reflective conductive layer 62 totally reflects or almost totally reflects light (conceptually indicated by a dashed arrow in FIG. 6) which is incident from the front face side on which an image is displayed. The first reflective conductive layer 62 is provided in a layer below the first lower transparent conductive layer 61.

The first upper transparent conductive layer 63 is a layer for suppressing corrosion of the first reflective conductive layer 62. The first upper transparent conductive layer 63 has light transmittance to transmit light. The first upper transparent conductive layer 63 is formed of, for example, at least one transparent conductive oxide selected from among indium tin oxide (ITO) and indium zinc oxide (IZO). A thickness t13 of the first upper transparent conductive layer 63 is, for example, approximately 10 nm, which is relatively thin. The first upper transparent conductive layer 63 is crystallized. The degree of crystallization of the first upper transparent conductive layer 63 may be lower than that of the second transparent conductive layer 65 to be described below.

The first lower transparent conductive layer 61, the first reflective conductive layer 62, and the first upper transparent conductive layer 63 are formed using wet etching in the same patterning step. The thickness t11 of the first lower transparent conductive layer 61 and the thickness t13 of the first upper transparent conductive layer 63 are equal to each other. In a case where the thickness t11 of the first lower transparent conductive layer 61 and the thickness t13 of the first upper transparent conductive layer 63 are different from each other, the first lower transparent conductive layer 61 and the first upper transparent conductive layer 63 differ from each other in an etching rate during formation thereof, and thus the amounts of inward shift of the outer peripheral portions thereof are different from each other. As a result, there is a concern that the shapes of the first lower transparent conductive layer 61 and the first upper transparent conductive layer 63 do not match. On the other hand, when the thickness t11 of the first lower transparent conductive layer 61 and the thickness t13 of the first upper transparent conductive layer 63 are equal to each other, the etching rates during the formation of the first lower transparent conductive layer 61 and the first upper transparent conductive layer 63 are equal to each other, and thus it is easy to match the shapes of the first lower transparent conductive layer 61 and the first upper transparent conductive layer 63.

As illustrated in FIG. 7 and FIG. 8, the first electrode 51 of the second organic EL element 60B is constituted by only the second transparent conductive layer 65 provided on the flattening film 29. The second transparent conductive layer 65 has light transmittance to transmit light. The second transparent conductive layer 65 is formed of, for example, at least one transparent conductive oxide selected from among indium tin oxide (ITO) and indium zinc oxide (IZO). A thickness t2 of the second transparent conductive layer 65 is, for example, approximately 50 nm to 100 nm, which is relatively thick. The second transparent conductive layer 65 transmits a large amount of light incident from the front face side on which an image is displayed (conceptually indicated by a dashed arrow in FIG. 7). The second transparent conductive layer 65 is crystallized. The first electrode 51 of the second organic EL element 60B is thinner than the first electrode 51 of the first organic EL element 60A (t2<t1).

The edge cover 52 is common to the first organic EL element 60A and the second organic EL element 60B. As illustrated in FIG. 4, the edge cover 52 partitions the first electrodes 51 of the adjacent subpixels Sp. The edge cover 52 is formed in a lattice pattern as a whole, and covers a peripheral edge portion of each of the first electrodes 51. Examples of the material of the edge cover 52 include an organic material such as a polyimide resin, an acrylic resin, a polysiloxane resin, and a novolak resin.

An opening 68 that exposes the first electrode 51 is formed for each organic EL element 60 in the edge cover 52. Each of the first organic EL element 60A and the second organic EL element 60B emits light in a region corresponding to the opening 68 of the edge cover. A region corresponding to the edge cover 52 in the subpixel Sp constitutes the light-emitting region E. A part of the surface of the edge cover 52 protrudes upward to form a photo spacer 69.

The second wall layer is layered on each of the two first wall layers. In other words, each of the second wall layers is formed in a rectangular frame shape extending along the entire periphery of the flattening film. These two second wall layers have geometrically similar shapes and are spaced apart from each other in the width direction of the frame region F. Each of the first wall layers is formed by the same material as that of and in the same layer as the edge cover 52.

The organic EL layer 53 has the same configuration as those of the first organic EL element 60A and the second organic EL element 60B. The organic EL layer 53 is an example of a light-emitting function layer. As illustrated in FIG. 6 and FIG. 7, the organic EL layer 53 is provided on each of the first electrodes 51. As illustrated in FIG. 9, the organic EL layer 53 includes a hole injection layer 70, a hole transport layer 71, a light-emitting layer 72, an electron transport layer 73, and an electron injection layer 74, which are provided in order on the first electrode 51. Some layers of the hole injection layer 70, the hole transport layer 71, the electron transport layer 73, and the electron injection layer 74 may be provided in common for the plurality of subpixels Sp as a continuous layer.

The hole injection layer 70 is also referred to as an anode electrode buffer layer. The hole injection layer 70 reduces the energy level difference between the first electrode 51 and the organic EL layer 53, and improves the efficiency of hole injection into the organic EL layer 53 from the first electrode 51. Examples of the material of the hole injection layer 70 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, and the like.

The hole transport layer 71 functions to migrate positive holes to the light-emitting layer 72 efficiently. Examples of the material of the hole transport layer 71 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

When a voltage is applied by the first electrode 51 and the second electrode 54, the light-emitting layer 72 recombines the positive holes injected from the first electrode 51 with the electrons injected from the second electrode 54 and emits light. The light-emitting layer 72 is formed of a different material depending on a luminescent color (red, green, or blue) of the organic EL element 60 in the individual subpixel Sp, for example.

Examples of the material of the light-emitting layer 72 include a metal oxinoid compound (8-hydroxyquinoline metal complexes), a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, polysilane, and the like.

The electron transport layer 73 migrates electrons to the light-emitting layer 72 efficiently. Examples of the material of the electron transport layer 73 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 74 is also referred to as a cathode electrode buffer layer. The electron injection layer 74 reduces the energy level difference between the second electrode 54 and the organic EL layer 53, and improves the efficiency of electron injection into the organic EL layer 53 from the second electrode 54. Examples of the material of the electron injection layer 74 include inorganic alkaline compounds such as lithium fluoride (LiF), magnesium fluoride (MgF2), calcium fluoride (CaF2), strontium fluoride (SrF2), and barium fluoride (BaF2), aluminum oxide (Al2O3), and strontium oxide (SrO).

The second electrode 54 has the same configuration as those of the first organic EL element 60A and the second organic EL element 60B. The second electrode 54 is provided in common for the plurality of subpixels Sp. The second electrode 54 covers the organic EL layer 53 and the edge cover 52, and overlaps the first electrode 51 with the organic EL layer 53 interposed therebetween. The second electrode 54 functions as a cathode electrode that injects electrons into the organic EL layer 53. The second electrode 54 has light transmittance to transmit light.

Examples of the material of the second electrode 54 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF).

The second electrode 54 may be formed of an alloy such as magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), lithium fluoride (LiF)-calcium (Ca)-aluminum (Al) and the like, for example.

The second electrode 54 may be formed of a conductive oxide, such as tin oxide (SnO), zinc oxide (ZnO), indium tin oxide (ITO), and indium zinc oxide (IZO), for example. The second electrode 54 is preferably formed of a material having a low work function to improve the efficiency of electron injection into the organic EL layer 53. The second electrode 54 may be formed by layering a plurality of layers formed of any of the materials described above.

As illustrated in FIG. 10, the first electrode 51 of the first organic EL element 60A and the first electrode 51 of the second organic EL element 60B are formed to have the same shape and the same size. The area of the first electrode 51 of the first organic EL element 60A and the area of the first electrode 51 of the second organic EL element 60B are equal to each other in a plan view.

The organic EL layer 53 of the first organic EL element 60A and the organic EL layer 53 of the second organic EL element 60B are formed to have the same shape and the same size. In a plan view, the area of the organic EL layer 53 of the first organic EL element 60A and the area of the organic EL layer 53 of the second organic EL element 60B are equivalent to each other. The "area of the organic EL layer 53" as mentioned herein means the area of a region in which the individual light-emitting layer 72 is provided for each subpixel Sp in a plan view (the same applies below).

In the edge cover 52, the opening 68 exposing the first electrode 51 of the first organic EL element 60A and the opening 68 exposing the first electrode 51 of the second organic EL element 60B are formed to have the same shape and the same size. The area of the opening 68 that exposes the first electrode 51 of the first organic EL element 60A and the area of the opening 68 that exposes the first electrode 51 of the second organic EL element 60B are equal to each other in a plan view. In the first display region D1 and the second display region D2, the areas of the light-emitting regions E of the subpixel Sp are equal to each other.

Sealing Film

The sealing film 80 is provided to cover the plurality of organic EL elements 60. The sealing film 80 protects the organic EL layer 53 of each of the organic EL elements 60 from moisture, oxygen, or the like. The sealing film 80 includes a first inorganic sealing layer 81 provided so as to cover the second electrode 54, an organic sealing layer 82 provided on the first inorganic sealing layer 81, and a second inorganic sealing layer 83 provided on the organic sealing layer 82.

The first inorganic sealing layer 81 and the second inorganic sealing layer 83 are formed of, for example, an inorganic insulating film such as a silicon oxide film, a silicon nitride film, and a silicon oxynitride film. The organic sealing layer 82 is formed of an organic material such as an acrylic resin, an epoxy resin, a silicone resin, a polyurea resin, a parylene resin, a polyimide resin, and a polyamide resin, for example. The sealing film 80 is covered by a surface protection film (not illustrated) bonded to the front face side of the organic EL display device 1.

Operation of Organic EL Display Device

In the organic EL display device 1, first, the corresponding emission control wiring line 24el is selected and brought into an inactive state in each of the subpixels Sp, the organic EL element 60 is brought into a non-light emission state. Then, when the gate wiring line 24gl that is to be scanned immediately before the gate wiring line 24gl corresponding to the organic EL element 60 in the non-light emission state is selected, the gate signal is input to the first TFT 30a via that gate wiring line 24gl, the first TFT 30a and the fourth TFT 30d are brought into an on state, and the voltage of the initialization power source wiring line 26il is applied to the capacitor 32. As a result, the charge of the capacitor 32 is discharged, and the voltage applied to the gate electrode 24ge of the fourth TFT 30d is initialized.

Subsequently, when the gate wiring line 24gl corresponding to the organic EL element 60 in the non-light emission state is selected to be brought into the active state, the second TFT 30b and the third TFT 30c are brought into the on state, and a predetermined voltage corresponding to the source signal transmitted via the source wiring line 28sl is written to the capacitor 32 via the fourth TFT 30d in the diode-connected state. Further, the seventh TFT 30g is brought into the on state, the voltage of the initialization power source wiring line 26il is applied to the first electrode 51 of the organic EL element 60, and the charge accumulated in the first electrode 51 is reset. Thereafter, when the emission control wiring line 24el corresponding to the organic EL element 60 in the non-light emission state is unselected to be brought into the active state, the fifth TFT 30e and the sixth TFT 30f are brought into the on state, and a drive current corresponding to the voltage applied to the gate electrode 24ge of the fourth TFT 30d is supplied from the high-level power source wiring line Pl to the organic EL element 60. In this way, each of the organic EL elements 60 emits light at a luminance corresponding to the drive current. As a result, an image is displayed in the display region D of the organic EL display device 1.

Method of Manufacturing Organic EL Display Device

Figure 11:
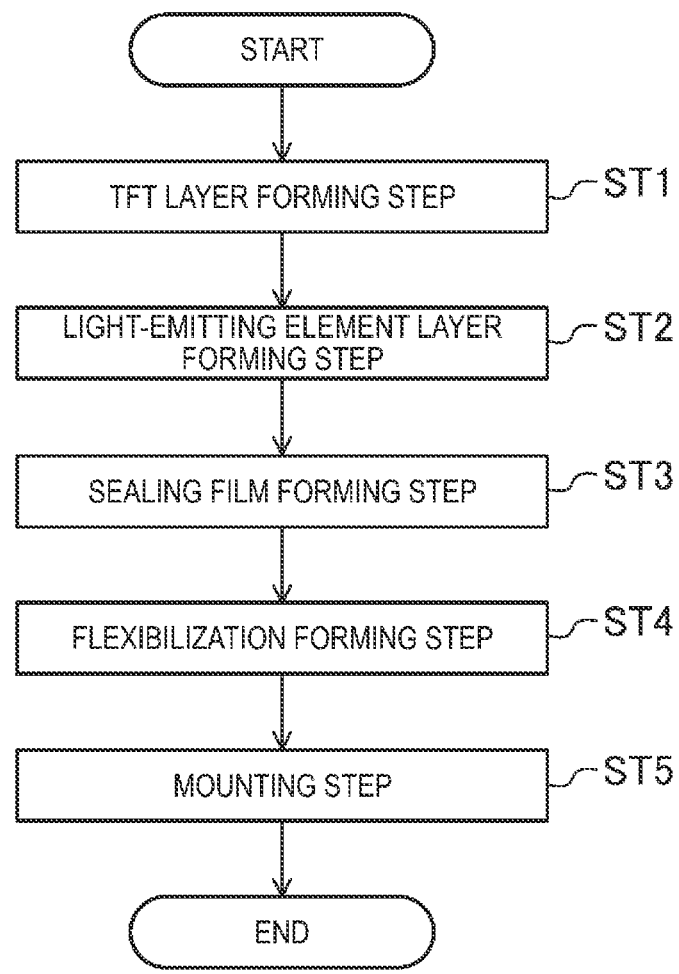
FIG. 11 is a flowchart schematically illustrating a method of manufacturing the organic EL display device according to the first embodiment.

A method of manufacturing the organic EL display device 1 according to the present embodiment will be described below. FIG. 11 is a flowchart schematically illustrating a method of manufacturing the organic EL display device 1.

As illustrated in FIG. 11, a method of manufacturing the organic EL display device 1 includes a TFT layer forming step ST1, a light-emitting element layer forming step ST2, a sealing film forming step ST3, a flexibilization step ST4, and a mounting step ST5.

TFT Layer Forming Step

In the TFT layer forming step ST1, the TFT layer 20 is formed by forming the resin substrate layer 10 on the glass substrate 100 using a well-known method such as photolithography and then forming the base coat film 21, the semiconductor layer 22, the gate insulating film 23, the first conductive layer 24 (the gate wiring lines 24gl, the gate electrodes 24ge, the emission control wiring lines 24el, the first capacitance electrodes 24ce, and the first lead-out wiring lines), the first interlayer insulating film 25, the second conductive layer 26 (the initialization power source wiring lines 26il, the first power source wiring lines 26pl, and the second capacitance electrodes 26ce), the second interlayer insulating film 27, the third conductive layer 28 (the source wiring lines 28sl, the source electrodes 28se, the drain electrodes 28de, the second power source wiring lines 28pl, the second lead-out wiring lines, the first frame wiring lines La, and the second frame wiring lines Lb), and the flattening film 29 on the substrate on which the resin substrate layer 10 has been formed.

Light-Emitting Element Layer Forming Step

Figure 12:
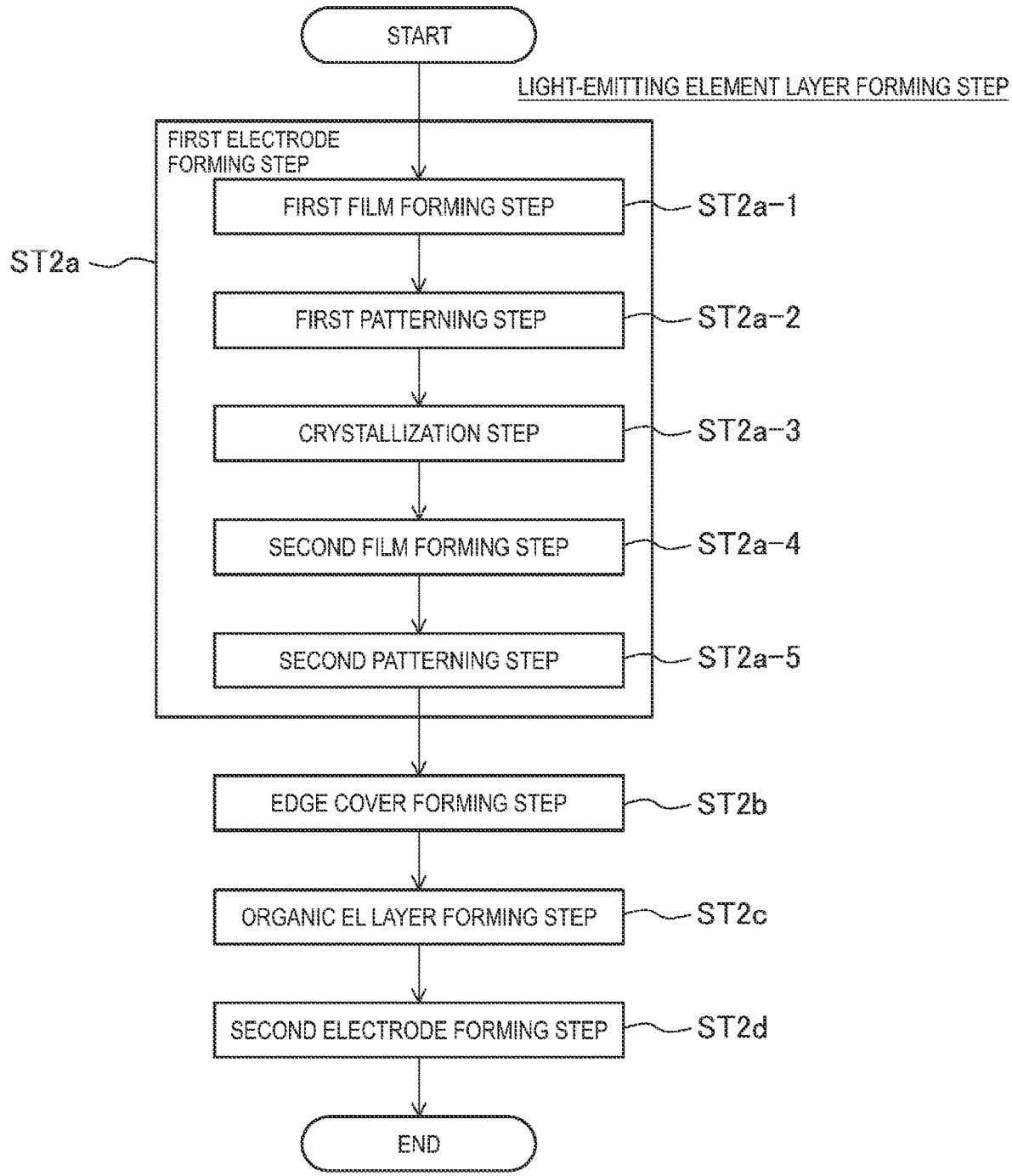
FIG. 12 is a flowchart schematically illustrating a light-emitting element layer forming step in the method of manufacturing the organic EL display device according to the first embodiment.

FIG. 12 is a flowchart schematically illustrating a light-emitting element layer forming step ST2.

As illustrated in FIG. 12, the light-emitting element layer forming step ST2 includes a first electrode forming step ST2a, an edge cover forming step ST2b, an organic EL layer forming step ST2c, and a second electrode forming step ST2d.

The first electrode forming step ST2a includes a first film forming step ST2a-1, a first patterning step ST2a-2, a crystallization step ST2a-3, a second film forming step ST2a-4, and a second patterning step ST2a-5. Here, the first film forming step ST2a-1 and the first patterning step ST2a-2 collectively correspond to a first step. The second film forming step ST2a-4 and the second patterning step ST2a-5 collectively correspond to a second step.

Figure 13:
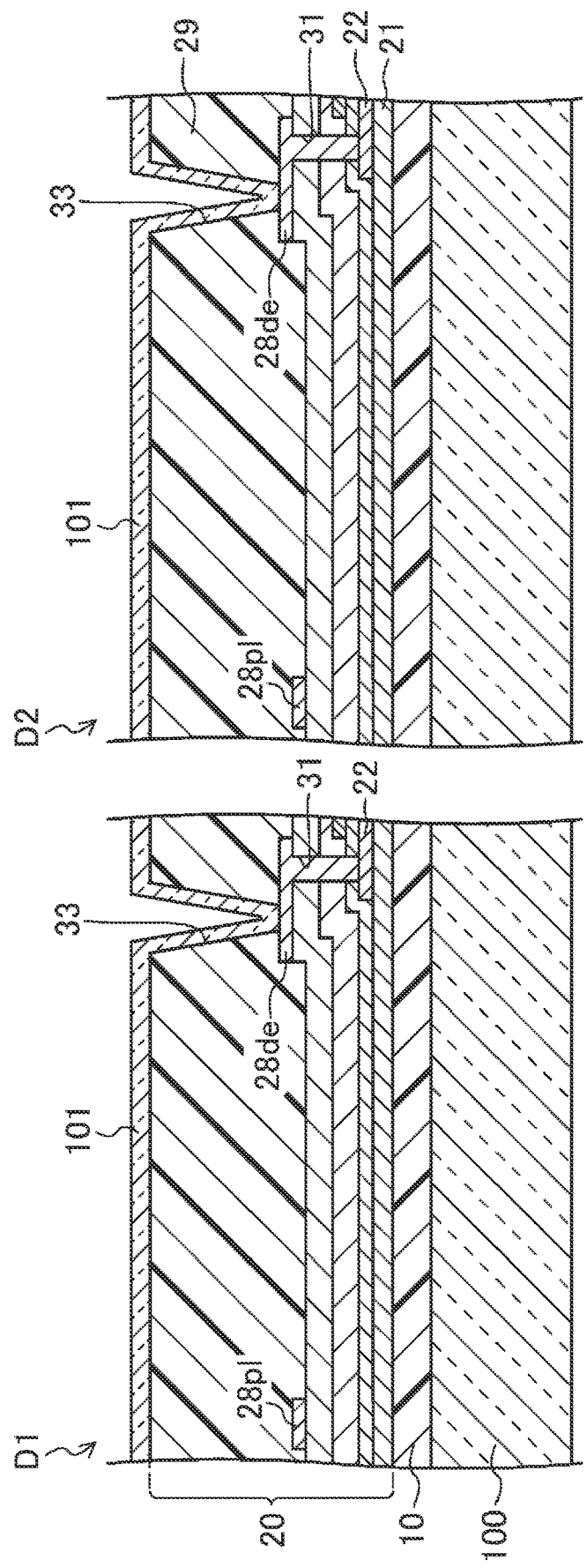
FIG. 13 is a cross-sectional view illustrating main portions of a substrate on which film formation has been performed in a first film forming step in the method of manufacturing the organic EL display device according to the first embodiment.

FIG. 13 is a cross-sectional view illustrating main portions of a substrate on which film formation has been performed in the first film forming step ST2a-1.

As illustrated in FIG. 13, in the first film forming step ST2a-1, a transparent conductive film 101 is formed on the substrate on which the TFT layer 20 has been formed, for example, by a sputtering method so that the transparent conductive film 101 is formed as a single layer or a plurality of layered layers. In the first film forming step ST2a-1, the transparent conductive film 101 is formed to be thicker than the transparent conductive films 103 and 105 formed in the second film forming step ST2a-4 to be performed later. The thickness of the transparent conductive film 101 that is formed here is set to, for example, approximately 50 nm to 100 nm.

Figure 14:
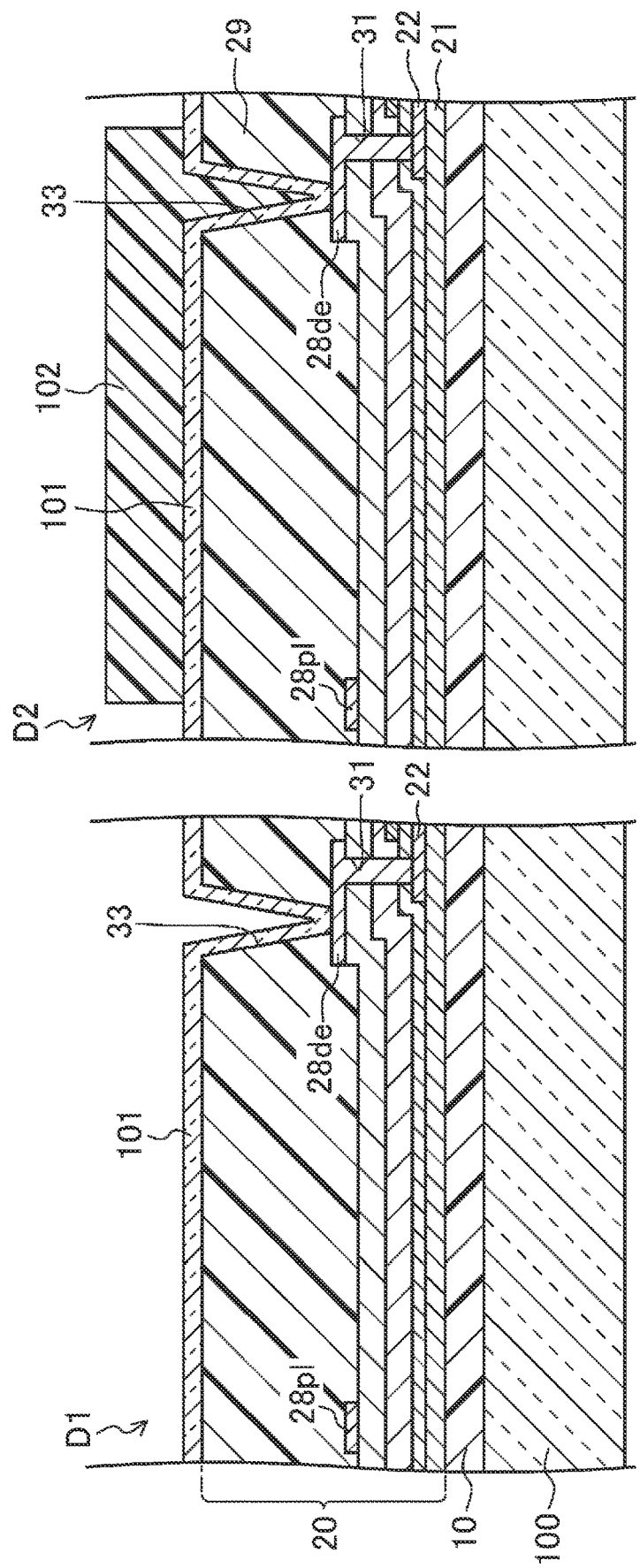
FIG. 14 is a cross-sectional view illustrating main portions of the substrate on which a resist layer has been formed in a first patterning step in the method of manufacturing the organic EL display device according to the first embodiment.
Figure 15:
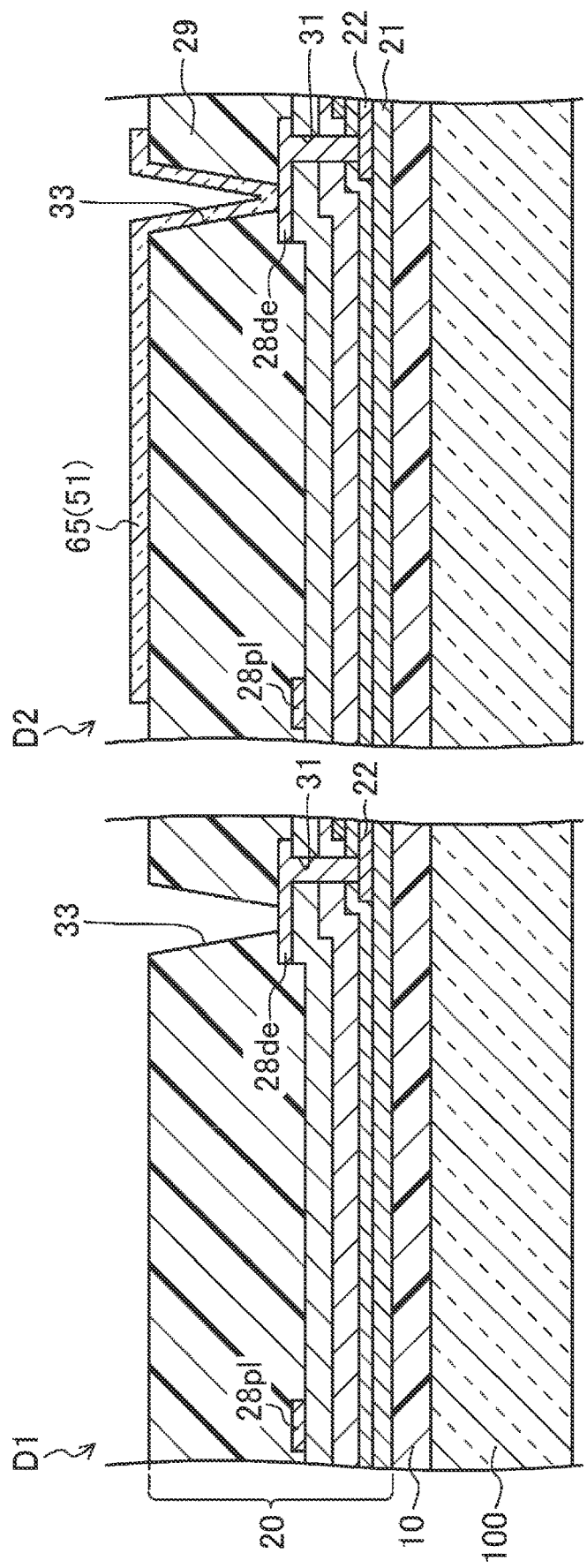
FIG. 15 is a cross-sectional view illustrating main portions of the substrate on which the first electrodes have been formed in a first patterning step in the method of manufacturing the organic EL display device according to the first embodiment.

FIG. 14 is a cross-sectional view illustrating main portions of the substrate on which a resist layer 102 has been formed in the first patterning step ST2a-2. FIG. 15 is a cross-sectional view illustrating main portions of the substrate on which the first electrode 51 has been formed in the first patterning step ST2a-2.

The first patterning step ST2a-2 is performed after the first film forming step ST2a-1. In the first patterning step ST2a-2, first, a photosensitive resin material is applied to the substrate on which the transparent conductive film 101 has been formed, for example, by a known coating method such as a spin coating method. Subsequently, the coating film of the photosensitive resin material is pre-baked, exposed, developed, and post-baked to pattern the coating film, thereby forming the island-shaped resist layer 102 in each region for forming the first electrode 51 in the second display region D2 as illustrated in FIG. 14.

Next, the transparent conductive film 101 is subjected to wet etching by being exposed to an etching solution using the resist layer 102 as a mask. By patterning the transparent conductive film 101 by the wet etching, the second transparent conductive layer 65 is formed from the transparent conductive film 101 in the second display region D2 as illustrated in FIG. 15. The second transparent conductive layer 65 is formed to be thicker than the first lower transparent conductive layer 61 and the first upper transparent conductive layer 63 to be formed later. In this manner, the first electrode 51 constituted by the second transparent conductive layer 65 is formed in the second display region D2.

The crystallization step ST2a-3 is performed after the first patterning step ST2a-2. In the crystallization step ST2a-3, annealing is performed on the substrate on which the first electrode 51 has been formed in the second display region D2, for example, at a temperature of approximately 200° C. to 250° C. for approximately 30 minutes to 120 minutes. In the annealing, the second transparent conductive layer 65 is crystallized by being heated. The crystallization of the transparent conductive layer formed of a transparent conductive oxide or the like by the annealing is not likely to proceed when the transparent conductive layer is excessively thin. The second transparent conductive layer 65 of the present embodiment has a thickness of equal to or greater than 50 nm and is relatively thick, and thus the crystallization of the second transparent conductive layer 65 by annealing is likely to proceed. Thus, the second transparent conductive layer 65 is suitably crystallized.

Figure 16:
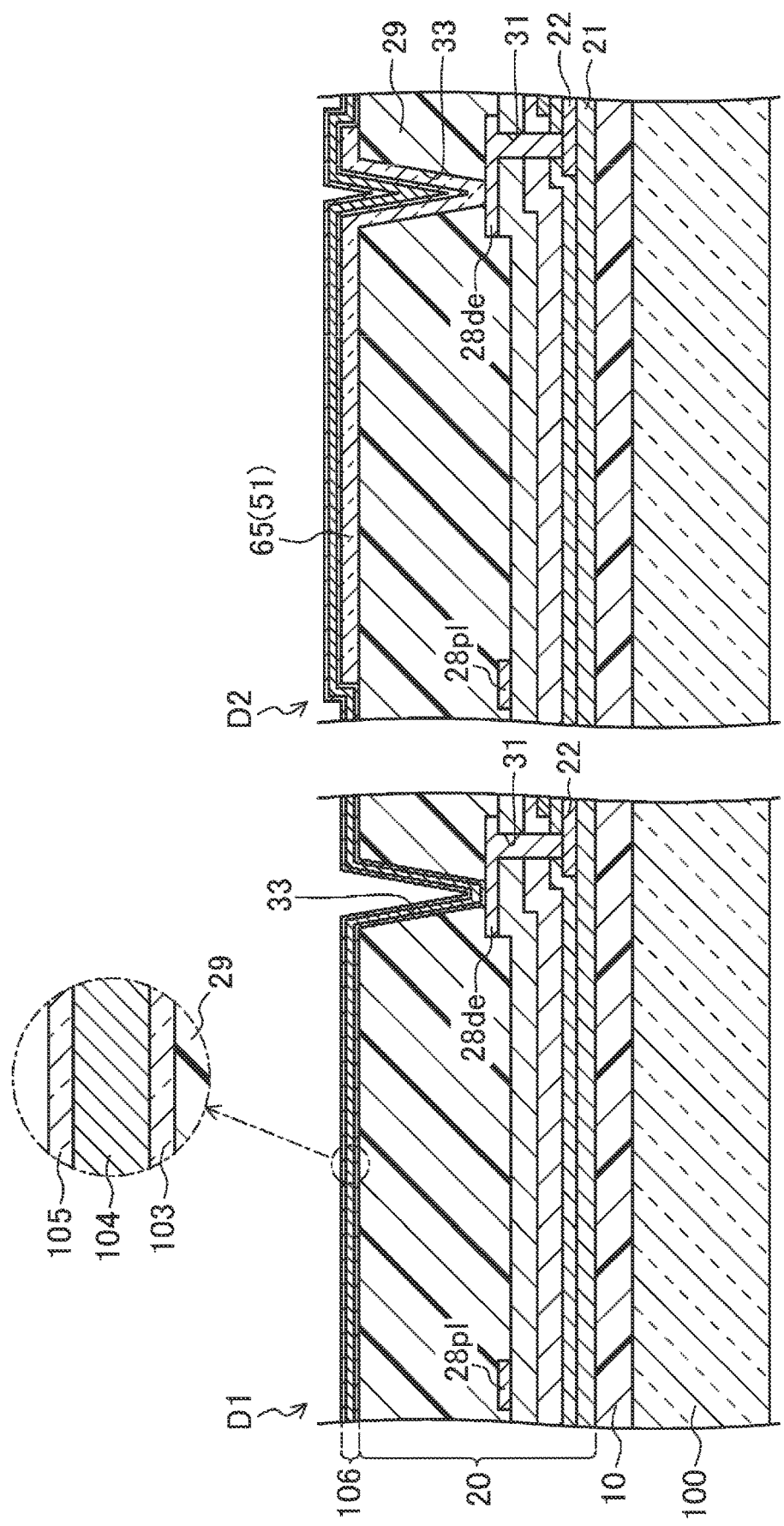
FIG. 16 is a cross-sectional view illustrating main portions of the substrate on which film formation has been performed in a second film forming step in the method of manufacturing the organic EL display device according to the first embodiment.

FIG. 16 is a cross-sectional view illustrating main portions of the substrate on which film formation has been performed in the second film forming step ST2a-4.

The second film forming step ST2a-4 is performed after the crystallization step ST2a-3. As illustrated in FIG. 16, in the second film forming step ST2a-4, a transparent conductive film 103, a reflective conductive film 104, and a transparent conductive film 105 are formed, for example, by a sputtering method so as to be layered in order on the substrate on which the first electrode 51 has been formed in the second display region D2. For example, the thicknesses of the transparent conductive films 103 and 105 that are formed here are set to approximately 10 nm, and the thickness of the reflective conductive film 104 is set to approximately 100 nm.

Figure 17:
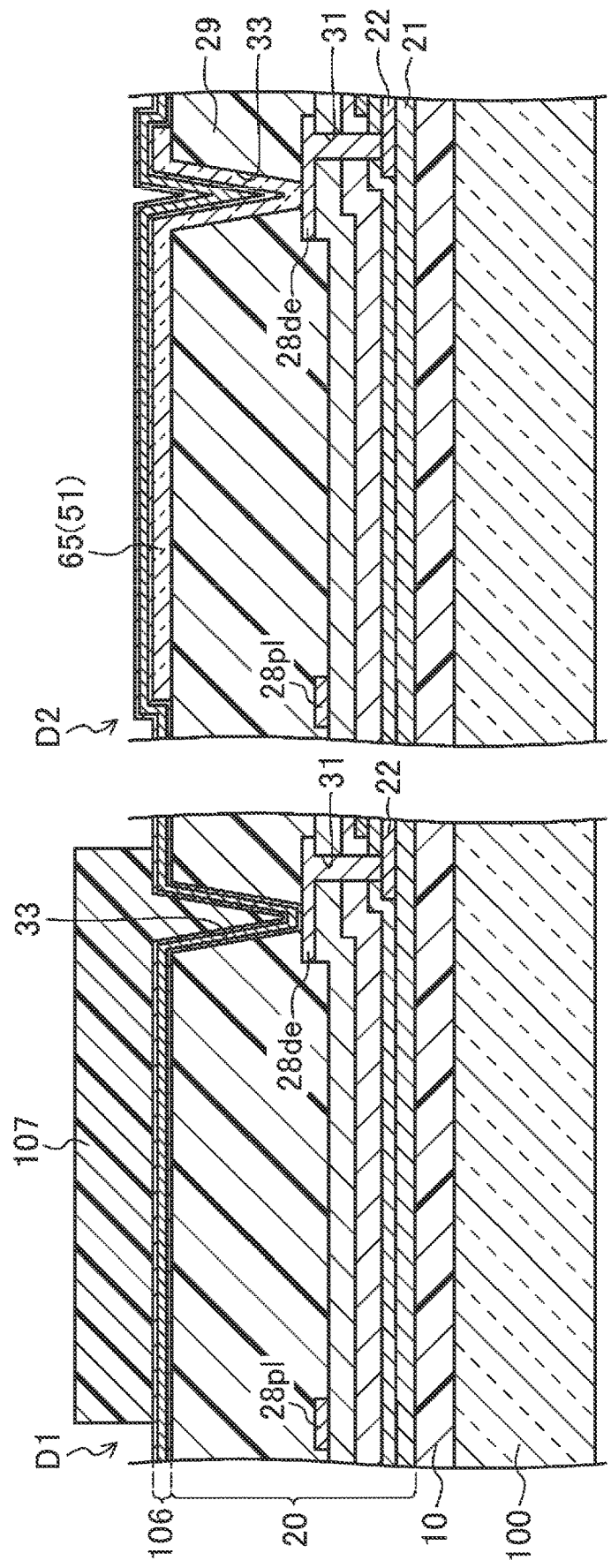
FIG. 17 is a cross-sectional view illustrating main portions of the substrate on which a resist layer has been formed in a second patterning step in the method of manufacturing the organic EL display device according to the first embodiment.
Figure 18:
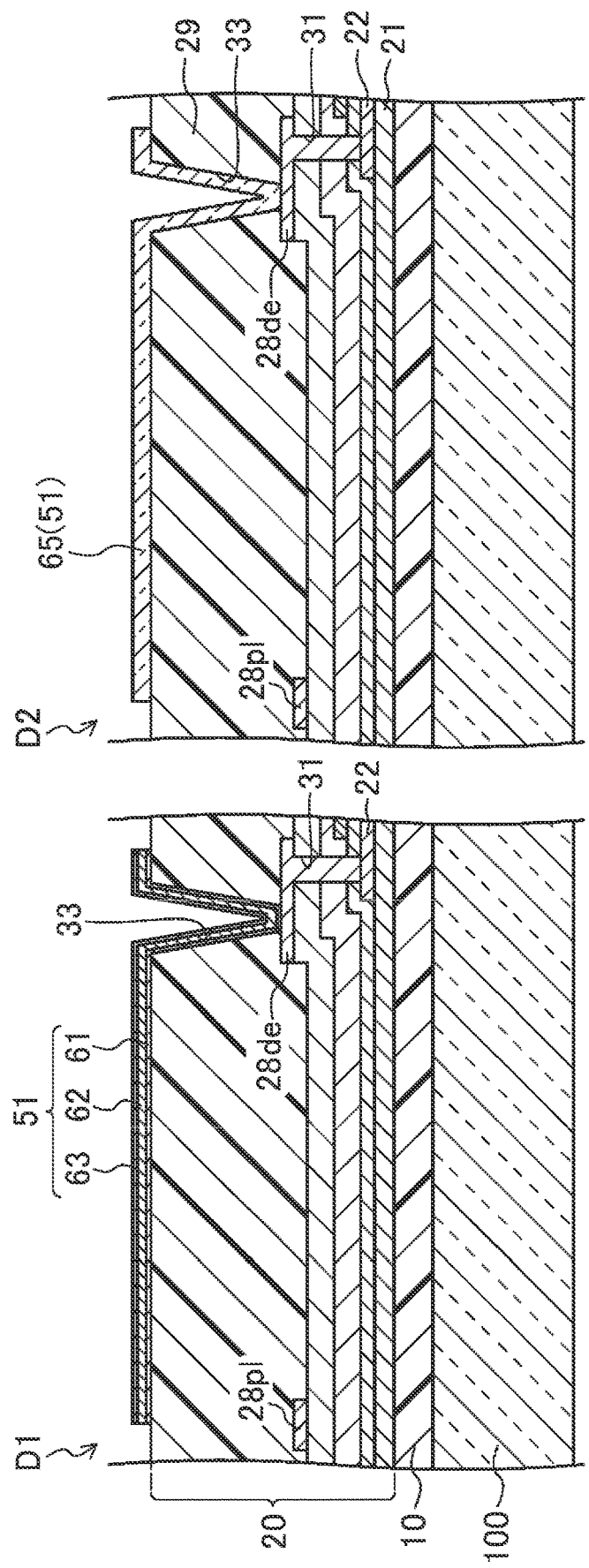
FIG. 18 is a cross-sectional view illustrating main portions of the substrate on which the first electrodes have been formed in the second patterning step in the method of manufacturing the organic EL display device according to the first embodiment.

FIG. 17 is a cross-sectional view illustrating main portions of the substrate on which a resist layer 107 has been formed in the second patterning step ST2a-5. FIG. 18 is a cross-sectional view illustrating main portions of a substrate on which the first electrode 51 is formed in the second patterning step ST2a-5.

The second patterning step ST2a-5 is performed after the second film forming step ST2a-4. First, in the second patterning step ST2a-5, first, a photosensitive resin material is applied to the substrate on which a layered conductive film 106 constituted by the transparent conductive film 103, the reflective conductive film 104, and the transparent conductive film 105 has been formed, for example, by a known coating method such as a spin coating method. Subsequently, the coating film of the photosensitive resin material is pre-baked, exposed, developed, and post-baked to pattern the coating film, thereby forming the island-shaped resist layer 107 in each region for forming the first electrode 51 in the first display region D1 as illustrated in FIG. 17.

Next, the layered conductive film 106 is subjected to wet etching by being exposed to an etching solution using the resist layer 107 as a mask. By patterning the layered conductive film 106 by wet etching, the first lower transparent conductive layer 61 is formed from the transparent conductive film 103, the first reflective conductive layer 62 is formed from the reflective conductive film 104, and the first upper transparent conductive layer 63 is formed from the transparent conductive film 105 in the first display region D1, as illustrated in FIG. 18.

In this manner, the first electrode 51 constituted by the first lower transparent conductive layer 61, the first reflective conductive layer 62, and the first upper transparent conductive layer 63 is formed in the first display region D1. At this time, the first electrode 51 in the second display region D2 formed first is exposed to an etching solution for patterning the layered conductive film 106. However, since the second transparent conductive layer 65 constituting the first electrode 51 in the second display region D2 is previously crystallized in the crystallization step ST2a-3, damage caused by the infiltration of the etching solution into the first electrode 51 is reduced.

The edge cover forming step ST2b is performed after the first electrode forming step ST2a. In the edge cover forming step ST2b, a photosensitive resin material is applied to the substrate on which the first electrode 51 has been formed using a well-known method such as photolithography, for example, by a known coating method such as a spin coating method. Subsequently, the coating film of the photosensitive resin material is pre-baked, exposed, developed, and post-baked to pattern the coating film, thereby forming the edge cover 52 and the second wall layer. In the prebaking and postbaking performed at this time, the substrate provided with the coating film is heated, for example, at a temperature of approximately 250° C. Thereby, the first lower transparent conductive layer 61 and the first upper transparent conductive layer 63 are crystallized. Further, in a case where the degree of crystallization of the second transparent conductive layer 65 is low, the crystallization of the second transparent conductive layer 65 is more likely to proceed.

The organic EL layer forming step ST2c is performed after the edge cover forming step ST2b. In the organic EL layer forming step ST2c, the hole injection layer 70, the hole transport layer 71, the light-emitting layer 72, the electron transport layer 73, and the electron injection layer 74 are formed in order on the substrate on which the edge cover 52 has been formed, for example, by a vacuum deposition method using a film forming mask called a fine metal mask (FMM) capable of performing patterning in units of sub-pixels, thereby forming the organic EL layer 53 on an individual first electrode 51. Note that some of the hole injection layer 70, the hole transport layer 71, the electron transport layer 73, and the electron injection layer 74 may be formed using a film forming mask called a CMM capable of performing patterning in units of display panels.

The second electrode forming step ST2d is performed after the organic EL layer forming step ST2c. In the second electrode forming step ST2d, a metal film is formed as a single layer or a plurality of layered layers on the substrate on which the organic EL layer 53 has been formed, for example, by a vacuum deposition method using a CMM film forming mask, to form the second electrode 54.

In this manner, in the light-emitting element layer forming step ST2, the light-emitting element layer 50 is formed on the TFT layer 20.

Sealing Film Forming Step

The sealing film forming step ST3 is performed after the light-emitting element layer forming step ST2. In the sealing film forming step ST3, first, the first inorganic sealing layer 81 is formed by forming an inorganic insulating film as a single layer or layering a plurality of inorganic insulating films on the substrate on which the light-emitting element layer 50 has been formed, for example, by a plasma CVD method using a CMM film forming mask.

Subsequently, an organic material is applied to the substrate on which the first inorganic sealing layer 81 has been formed, for example, by an ink-jet method, thereby forming the organic sealing layer 82.

Next, the second inorganic sealing layer 83 is formed by forming an inorganic insulating film as a single layer or layering a plurality of inorganic insulating films on the substrate on which the organic sealing layer 82 has been formed, for example, by a plasma CVD method using a CMM film forming mask.

In this manner, in the sealing film forming step ST3, the sealing film 80 in which the first inorganic sealing layer 81, the organic sealing layer 82, and the second inorganic sealing layer 83 are layered is formed.

Flexibilization Step

The flexibilization step ST4 is performed after the sealing film forming step ST3. In the flexibilization step ST4, first, a surface protection film is bonded to the surface of the substrate on which the sealing film 80 has been formed. Subsequently, the glass substrate 100 is peeled off from the lower surface of the resin substrate layer 10 by irradiating the lower surface of the resin substrate layer 10 with laser light from the glass substrate 100 side. Then, a rear surface protection film 11 is bonded to the lower surface of the resin substrate layer 10 from which the glass substrate 100 has been peeled off.

Mounting Step

The mounting step ST5 is performed after the flexibilization step ST4. In the mounting step ST5, the wiring line substrate Cb is connected to the terminal portion T of the substrate from which the glass substrate 100 has been peeled off by using a conductive material such as an anisotropic conductive film (ACF) or an anisotropic conductive paste (ACP), and thus an external circuit such as a display control circuit is mounted together with the wiring line substrate Cb by allowing electrical conduction between the wiring line substrate Cb and the terminal portion T.

Thereafter, the organic EL display device 1 is accommodated in the housing together with the camera 3, and the camera 3 is installed at a position overlapping the second display region D2 in a plan view on the back face side of the organic EL display device 1.

The organic EL display device 1 according to the present embodiment can be manufactured as described above.

Effects of First Embodiment

A characteristic (1) of the organic EL display device 1 according to the first embodiment is that the first electrode 51 of the first organic EL element 60A positioned in the first display region D1 includes the first reflective conductive layer 62 having light reflectivity and the first upper transparent conductive layer 63 provided on the first reflective conductive layer 62 and having light transmittance, the first electrode 51 of the second organic EL element 60B positioned in the second display region D2 includes the second transparent conductive layer 65 having light transmittance, and the second transparent conductive layer 65 is crystallized and thicker than the first upper transparent conductive layer 63.

According to the characteristic (1) of the organic EL display device 1 according to the first embodiment, since the first electrode 51 of the second organic EL element 60B is constituted by the second transparent conductive layer 65, it is possible to increase the transmittance of light used for imaging of the camera 3 in the display region D. In addition, since the second transparent conductive layer 65 is thicker than the first upper transparent conductive layer 63 included in the first electrode 51 of the first organic EL element 60A, it is easy to crystallize the second transparent conductive layer from the first upper transparent conductive layer by annealing. Thus, in the manufacture of the organic EL display device 1, the first electrode 51 of the second organic EL element 60B is formed, the second transparent conductive layer 65 constituting the first electrode 51 is crystallized, and then the first electrode 51 of the first organic EL element 60A is formed, and thus it is possible to prevent an etching solution at the time of patterning the first electrode 51 of the first organic EL element 60A from infiltrating into the first electrode 51 of the second organic EL element 60B and reduce damage to the first electrode 51 of the second organic EL element 60B.

A characteristic (2) of the organic EL display device 1 according to the first embodiment is that the first electrode 51 of the second organic EL element 60B is thinner than the first electrode 51 of the first organic EL element 60A.

According to the characteristic (2) of the organic EL display device according to the first embodiment, the first electrode 51 of the second organic EL element 60B is relatively thin, and thus the transmittance of the light of the first electrode 51 can be increased. This contributes to an increase in the amount of light that can be used for image capture by the camera 3 and an improvement in image capture performance of the in-camera 3 which is combined with the organic EL display device 1.

A characteristic (3) of the organic EL display device 1 according to the first embodiment is that the first electrode 51 of the first organic EL element 60A further includes, in a layer below the first reflective conductive layer 62, the first lower transparent conductive layer 61 having light transmittance, and the second transparent conductive layer 65 is thicker than the first lower transparent conductive layer 61.

According to the characteristic (3) of the organic EL display device 1 according to the first embodiment, since the second transparent conductive layer 65 is thicker than the first lower transparent conductive layer 61, the thickness of the first lower transparent conductive layer 61 and the thickness of the first upper transparent conductive layer 63 can be made equal to each other. Thereby, etching rates during the formation of the first lower transparent conductive layer 61 and the first upper transparent conductive layer 63 are equal to each other, and thus it is easy to match the shapes of the first lower transparent conductive layer 61 and the first upper transparent conductive layer 63.

A characteristic (4) of the organic EL display device 1 according to the first embodiment is that the area of the first electrode 51 of the first organic EL element 60A and the area of the first electrode 51 of the second organic EL element 60B are equal to each other.

A characteristic (5) of the organic EL display device 1 according to the first embodiment is that the organic EL display device 1 further includes the edge cover 52 that covers a peripheral edge portion of the first electrode 51, the opening 68 exposing the first electrode 51 is formed for each organic EL element 60 in the edge cover 52, and the area of the opening 68 that exposes the first electrode 51 of the first organic EL element 60A and the area of the opening 68 that exposes the first electrode 51 of the second organic EL element 60B are equal to each other.

A characteristic (6) of the organic EL display device 1 according to the first embodiment is that the area of the organic EL layer 53 of the first organic EL element 60A and the area of the organic EL layer 53 of the second organic EL element 60B are equal to each other.

According to the characteristics (4) to (6) of the organic EL display device according to the first embodiment, the area of the first electrode 51, the area of the opening 68 that exposes the first electrode 51, and the area of the organic EL layer 53 are equal to each other in the first organic EL element 60A and the second organic EL element 60B, and thus it is possible to align the areas of the light-emitting regions E of the subpixels Sp in the first display region D1 and the second display region D2 and make the resolution of the screen uniform.

A characteristic (1) of the method of manufacturing the organic EL display device 1 according to the first embodiment is that the first electrode forming step ST2$a$ included in the light-emitting element layer forming step ST2 includes the first steps ST2$a$-1 and ST2$a$-2 of forming the transparent conductive film 101 on the substrate on which the TFT layer 20 has been formed and patterning the transparent conductive film 101 by wet etching to form the second transparent conductive layer 65 from the transparent conductive film 101 in the second display region D2, the crystallization step ST2$a$-3 of crystallizing the second transparent conductive layer 65 by heating, and the second steps ST2$a$-4 and ST2$a$-5 of forming the reflective conductive film 104 and the transparent conductive film 105 in order on the substrate on which the second transparent conductive layer 65 has been formed after the crystallization step ST2$a$-3 and patterning the reflective conductive film 104 and the transparent conductive film 105 by wet etching to form the first reflective conductive layer 62 from the reflective conductive film 104 in the first display region D1 and form the first upper transparent conductive layer 63 from the transparent conductive film 105, and the second transparent conductive layer 65 is formed to be thicker than the first upper transparent conductive layer 63 in the first steps ST2$a$-1 and ST2$a$-2.

According to the characteristic (1) of the method of manufacturing the organic EL display device 1 according to the first embodiment, the second transparent conductive layer 65 is formed to be thicker than the first upper transparent conductive layer 63 in the first steps ST2$a$-1 and ST2$a$-2, and thus the second transparent conductive layer 65 is easily crystallized in the crystallization step ST2$a$-3. Thereby, it is possible to prevent an etching solution at the time of patterning the first electrode 51 of the first organic EL element 60A in the second steps ST2$a$-4 and ST2$a$-5 from infiltrating into the first electrode 51 of the second organic EL element 60B and reduce damage to the first electrode 51 of the second organic EL element 60B.

A characteristic (2) of the method of manufacturing the organic EL display device 1 according to the first embodiment is that the first electrode 51 constituted by the second transparent conductive layer 65 is formed in the first steps ST2$a$-1 and ST2$a$-2.

According to the characteristic (2) of the method of manufacturing the organic EL display device 1 according to the first embodiment, the first electrode 51 constituted by the second transparent conductive layer 65 is formed in the first steps ST2$a$-1 and ST2$a$-2, and thus a film forming step can be reduced as compared to a case where a first electrode constituted by a plurality of layers including a reflective conductive layer is formed. This contributes to a reduction in manufacturing costs and an improvement in manufacturing efficiency of the organic EL display device 1.

Modification Example of First Embodiment

Figure 19:
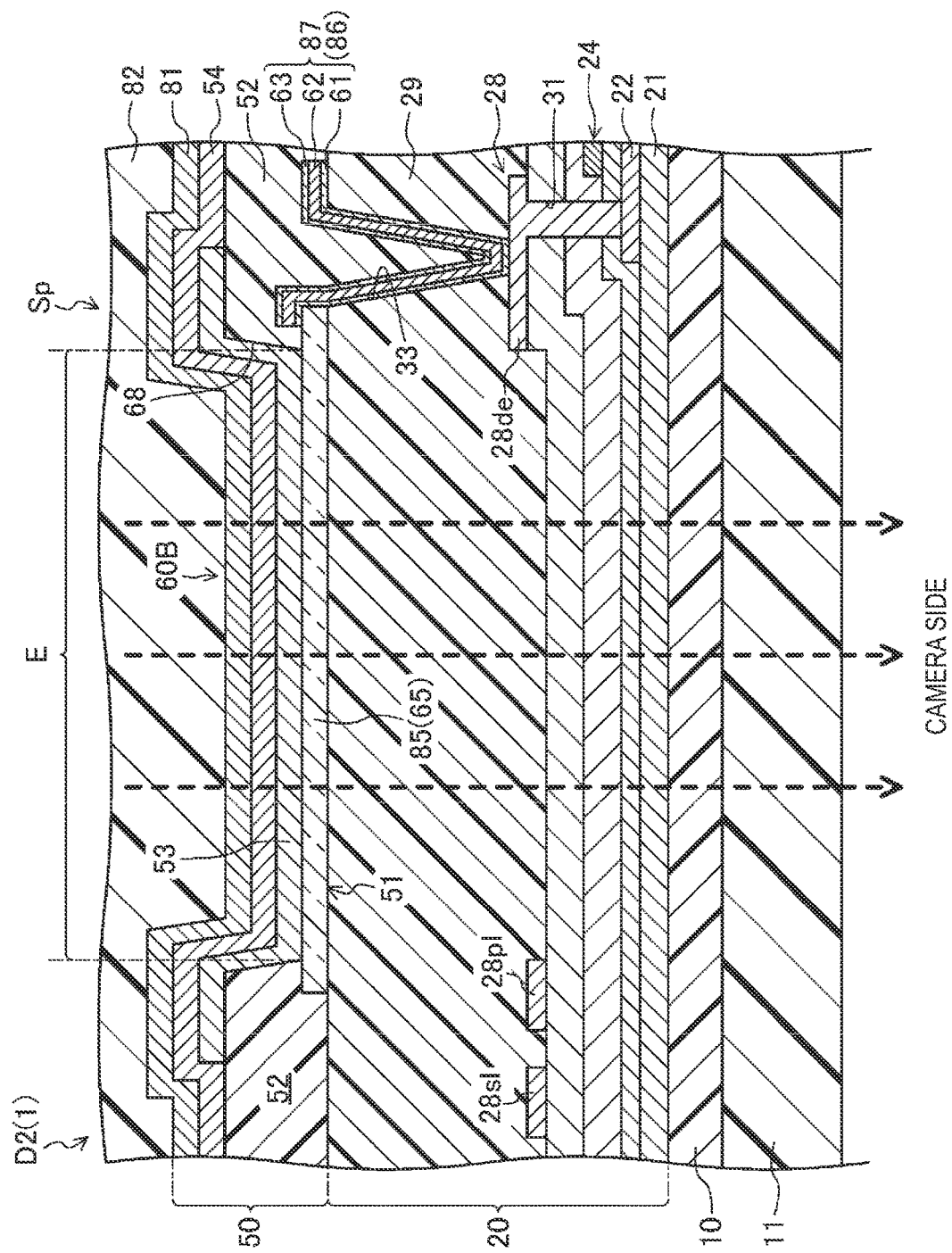
FIG. 19 is a cross-sectional view illustrating main portions in a second display region of an organic EL display device according to a modification example of the first embodiment.

FIG. 19 is a cross-sectional view illustrating main portions in the second display region D2 of the organic EL display device 1 according to the present modification example.

In the organic EL display device 1 according to the first embodiment, the first electrode 51 of the second organic EL element 60B is constituted by the second transparent conductive layer 65. However, as illustrated in FIG. 19, in the organic EL display device 1 according to the present modification example, a first electrode 51 of a second organic EL element 60B includes a first conductive portion 85 constituted by a second transparent conductive layer 65 and a second conductive portion 87 constituted by a layered conductor 86 in which a plurality of conductive layers are layered.

The first conductive portion 85 corresponds to the opening 68 of the edge cover 52, and constitutes a portion facing the second electrode 54 via the organic EL layer 53. The second conductive portion 87 has a structure in which the first lower transparent conductive layer 61, the first reflective conductive layer 62, and the first upper transparent conductive layer 63 which are the same as those of the first electrode 51 of the first organic EL element 60A are layered in order.

The second conductive portion 87 is formed to cover the contact hole 33 of the flattening film 29 and the periphery of the opening. In addition, the second conductive portion 87 is connected to the first conductive portion 85 in an overlapping manner on the lower side of the edge cover 52. The second conductive portion 87 constitutes a portion connected to the drain electrode 28de of the sixth TFT 30f in the first electrode 51 of the second organic EL element 60B.

In order to manufacture the organic EL display device 1 according to the present modification example, in the first patterning step ST2a-2 described in the first embodiment, the second transparent conductive layer 65 may be formed from the transparent conductive film 101 in a portion excluding the contact hole 33 for connection to the drain electrode 28de of the sixth TFT 30f and the periphery of the opening in a region for forming the first electrode 51 of the first organic EL element 60A.

Further, in the second patterning step ST2a-5, the first electrode 51 of the first organic EL element 60A may be formed, and the second conductive portion 87 constituted by the same layered conductor 86 as that of the first electrode 51 of the first organic EL element 60A may be formed in the contact hole 33 for connection to the drain electrode 28de of the sixth TFT 30f and the periphery of the opening in a region for forming the first electrode 51 of the second organic EL element 60B.

Effects of Modification Example of First Embodiment

A characteristic of the organic EL display device 1 according to the modification example of the first embodiment is that the first electrode 51 of the second organic EL element 60B includes the second conductive portion 87 constituted by the layered conductor 86 including the first reflective conductive layer 62, and the second conductive portion 87 is connected to the drain electrode 28de of the sixth TFT 30f.

According to the characteristic of the organic EL display device 1 according to the modification example of the first embodiment, the second conductive portion 87 connected to the drain electrode 28de of the sixth TFT 30f in the first electrode 51 of the second organic EL element 60B is constituted by the layered conductor 86 including the first reflective conductive layer 62, and thus it is possible to reduce contact resistance between the first electrode 51 of the second organic EL element 60B and the drain electrode 28de of the sixth TFT 30f.

Second Embodiment

An organic EL display device 1 according to a second embodiment is different from the organic EL display device 1 according to the first embodiment in terms of a configuration of a first electrode 51 of a second organic EL element 60B. Note that, in the present embodiment, the organic EL display device 1 is configured in the same manner as that in the first embodiment except that the configuration of the first electrode 51 of the second organic EL element 60B is different from that in the first embodiment.

Configuration of Organic EL Display Device

Figure 20:
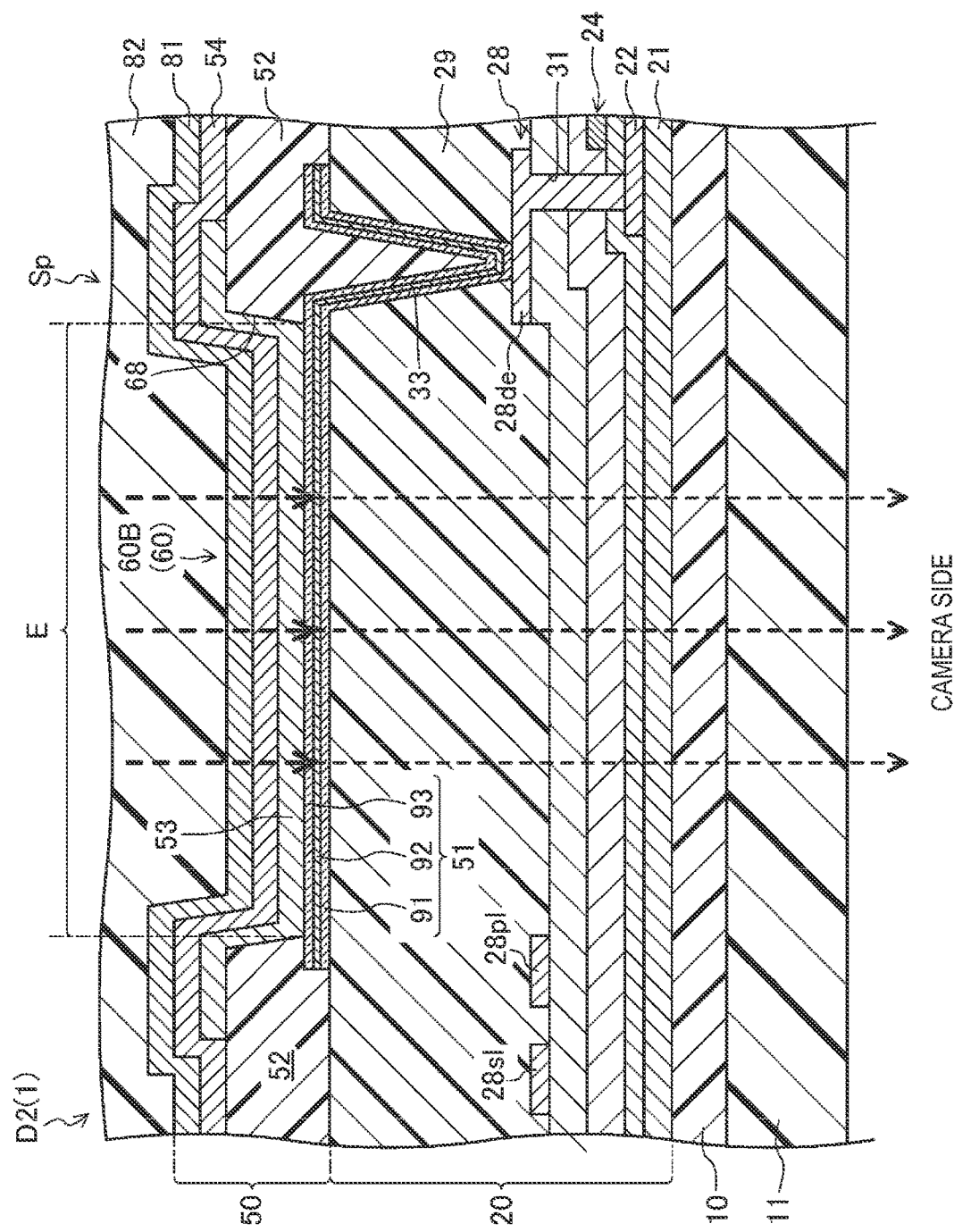
FIG. 20 is a cross-sectional view illustrating main portions in a second display region of an organic EL display device according to a second embodiment.
Figure 21:
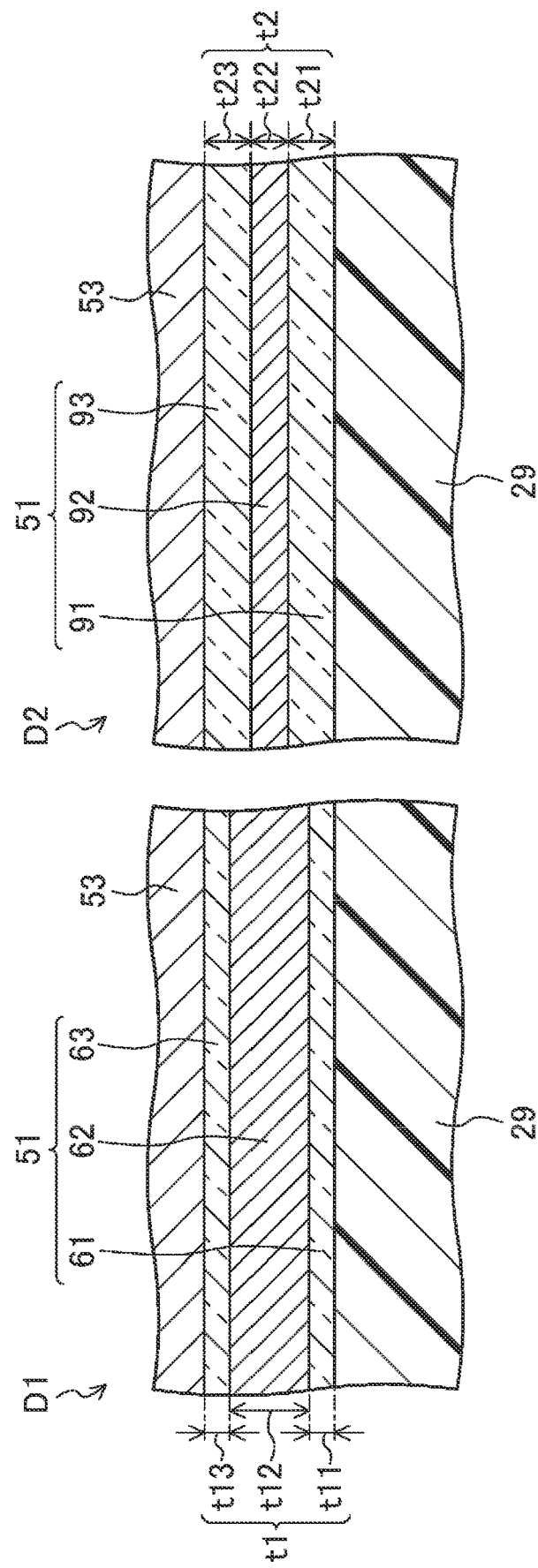
FIG. 21 is a cross-sectional view illustrating a configuration of first electrodes in a first display region and a second display region of the organic EL display device according to the second embodiment.

FIG. 20 is a cross-sectional view illustrating main portions in the second display region D2 of the organic EL display device 1 according to the second embodiment. FIG. 21 is a cross-sectional view illustrating configurations of a first electrode 51 of a first organic EL element 60A and a configuration of the first electrode 51 of the second organic EL element 60B in the organic EL display device 1 according to the second embodiment.

As illustrated in FIG. 20 and FIG. 21, the first electrode 51 of the second organic EL element 60B in the present embodiment includes a second lower transparent conductive layer 91, a second reflective conductive layer 92, and a second upper transparent conductive layer 93 which are provided in order on the flattening film 29. Note that the first electrode 51 of the second organic EL element 60B is thinner than the first electrode 51 of the first organic EL element 60A (t2<t1), similarly to the first embodiment.

The second lower transparent conductive layer 91 is a layer for suppressing corrosion of the second reflective conductive layer 92 and improving the adhesion of the first electrode 51 to the flattening film 29. The second lower transparent conductive layer 91 has light transmittance to transmit light. The second lower transparent conductive layer 91 is formed of, for example, at least one transparent conductive oxide selected from among indium tin oxide (ITO) and indium zinc oxide (IZO).

The second lower transparent conductive layer 91 is crystallized. The second lower transparent conductive layer 91 is thicker than the first lower transparent conductive layer 61 and the first upper transparent conductive layer 63 (t21>t11, t21>t13). A thickness t21 of the second lower transparent conductive layer 91 is, for example, approximately 20 nm to 30 nm. Thereby, crystallization of the second lower transparent conductive layer 91 by annealing is more likely to proceed than the first lower transparent conductive layer 61 and the first upper transparent conductive layer 63. The second lower transparent conductive layer 91 is positioned in a layer below the second reflective conductive layer 92.

The second reflective conductive layer 92 has light reflectivity to reflect light. The second reflective conductive layer 92 is formed of, for example, at least one metal material selected from among silver (Ag), a silver alloy, aluminum (Al), and an aluminum alloy. The second reflective conductive layer 92 is thinner than the first reflective conductive layer 62 (t22<t12). A thickness t22 of the second reflective conductive layer 92 is, for example, approximately 20 nm to 50 nm. The second reflective conductive layer 92 transmits a half of light incident from the front face side on which an image is displayed (conceptually indicated by a dashed arrow in FIG. 20) and reflects a half of the light. The second reflective conductive layer 92 is positioned in a layer below the second upper transparent conductive layer 93.

The second upper transparent conductive layer 93 corresponds to a second transparent conductive layer. The second upper transparent conductive layer 93 is a layer for suppressing corrosion of the second reflective conductive layer 92. The second upper transparent conductive layer 93 has light transmittance to transmit light. The second upper transparent conductive layer 93 is formed of, for example, at least one transparent conductive oxide selected from among indium tin oxide (ITO) and indium zinc oxide (IZO).

A thickness t23 of the second upper transparent conductive layer 93 is, for example, approximately 20 nm to 30 nm, which is relatively thick. The second upper transparent conductive layer 93 is crystallized. The second upper transparent conductive layer 93 is thicker than the first lower transparent conductive layer 61 and the first upper transparent conductive layer 63 (t23>t11, t23>t13). Thereby, crystallization of the second upper transparent conductive layer 93 by annealing is more likely to proceed than the first lower transparent conductive layer 61 and the first upper transparent conductive layer 63.

The second lower transparent conductive layer 91, the second reflective conductive layer 92, and the second upper transparent conductive layer 93 are formed using wet etching in the same patterning step. The thickness t21 of the second lower transparent conductive layer 91 and the thickness t23 of the second upper transparent conductive layer 93 are equal to each other. Accordingly, it is easy to match the shapes of the second lower transparent conductive layer 91 and the second upper transparent conductive layer 93 by making etching rates during the formation of the second lower transparent conductive layer 91 and the second upper transparent conductive layer 93 equal to each other.

Method of Manufacturing Organic EL Display Device A method of manufacturing the organic EL display device 1 according to the present embodiment will be described below.

The method for manufacturing the organic EL display device 1 includes a TFT layer forming step ST1, a light-emitting element layer forming step ST2, a sealing film forming step ST3, a flexibilization step ST4, and a mounting step ST5. Among these steps, the TFT layer forming step ST1, the sealing film forming step ST3, the flexibilization step ST4, and the mounting step ST5 are the same as those in the first embodiment.

The light-emitting element layer forming step ST2 includes a first electrode forming step ST2a, an edge cover forming step ST2b, an organic EL layer forming step ST2c, and a second electrode forming step ST2d. Among these steps, the edge cover forming step ST2b, the organic EL layer forming step ST2c, and the second electrode forming step ST2d are the same as those in the first embodiment.

The first electrode forming step ST2a includes a first film forming step ST2a-1, a first patterning step ST2a-2, a crystallization step ST2a-3, a second film forming step ST2a-4, and a second patterning step ST2a-5. Here, the first film forming step ST2a-1 and the first patterning step ST2a-2 collectively correspond to a first step. The second film forming step ST2a-4 and the second patterning step ST2a-5 collectively correspond to a second step.

Figure 22:
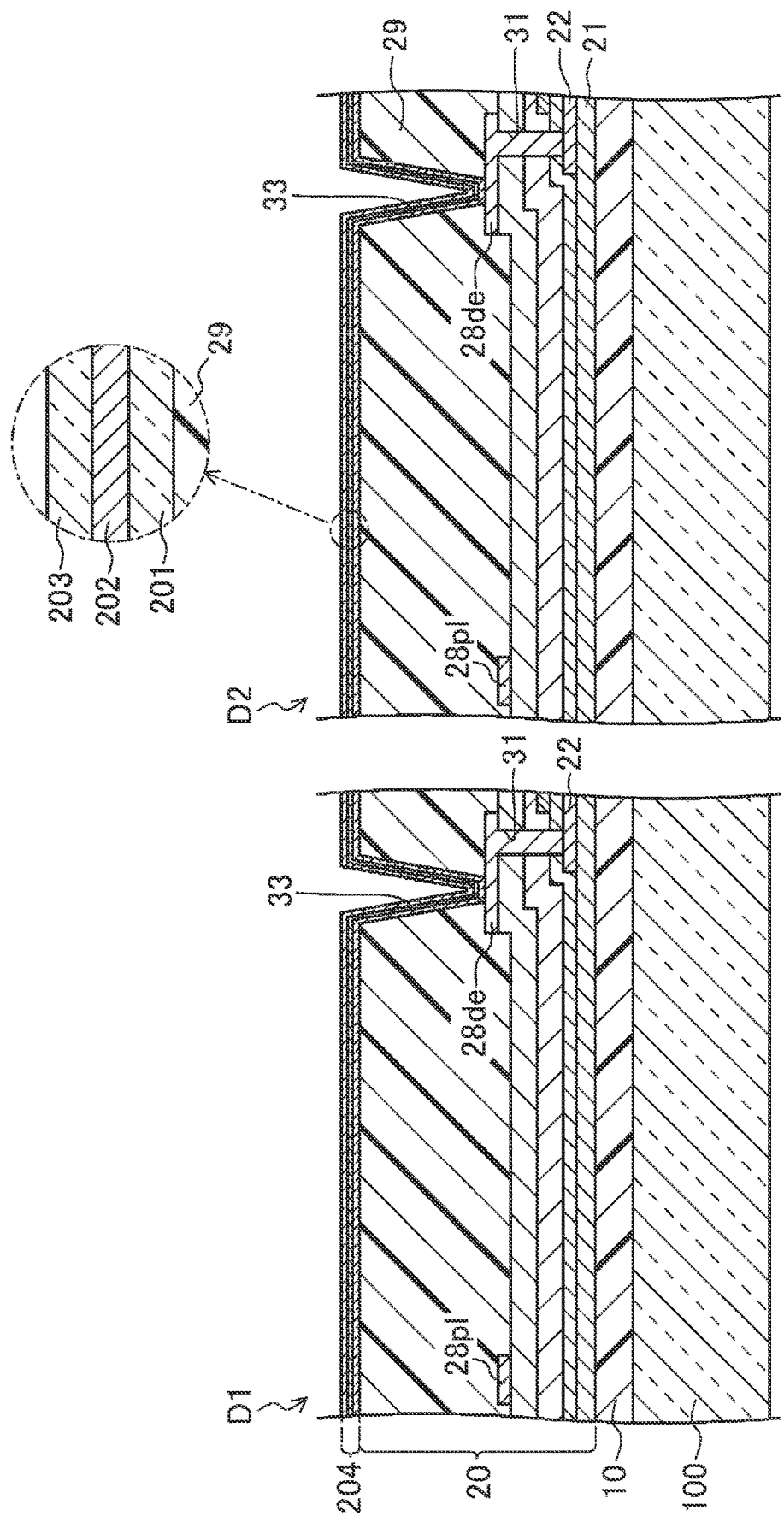
FIG. 22 is a cross-sectional view illustrating main portions of a substrate on which film formation has been performed in a first film forming step in a method of manufacturing the organic EL display device according to the second embodiment.

FIG. 22 is a cross-sectional view illustrating main portions of a substrate on which film formation has been performed in the first film forming step ST2a-1.

As illustrated in FIG. 22, in the first film forming step ST2a-1, a transparent conductive film 201, a reflective conductive film 202, and a transparent conductive film 203 are formed, for example, by a sputtering method so as to be layered in order on the substrate on which the TFT layer 20 has been formed. For example, the thicknesses of the transparent conductive film 201 and the transparent conductive film 203 that are formed here are set to approximately 20 nm to 30 nm, and the thickness of the reflective conductive film 202 is set to approximately 20 nm to 50 nm.

Figure 23:
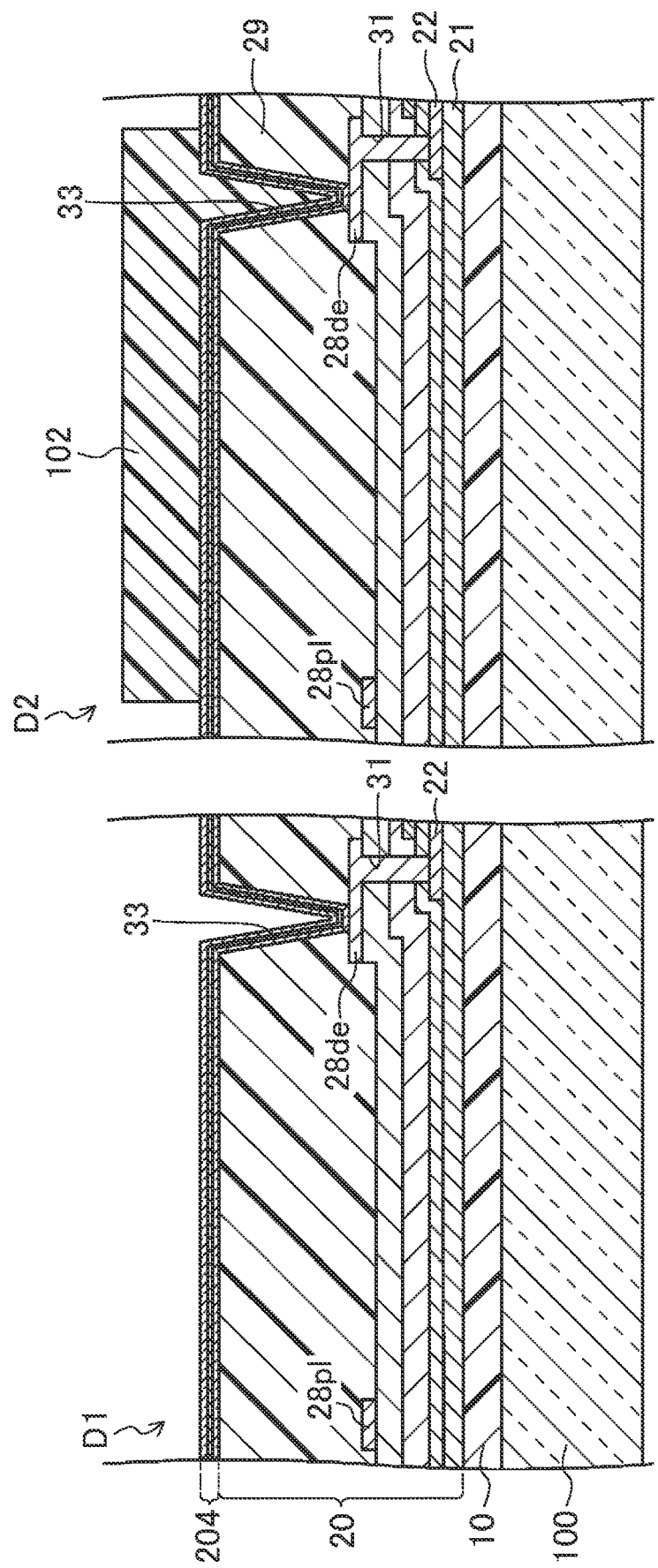
FIG. 23 is a cross-sectional view illustrating main portions of the substrate on which a resist layer has been formed in a first patterning step in the method of manufacturing the organic EL display device according to the second embodiment.
Figure 24:
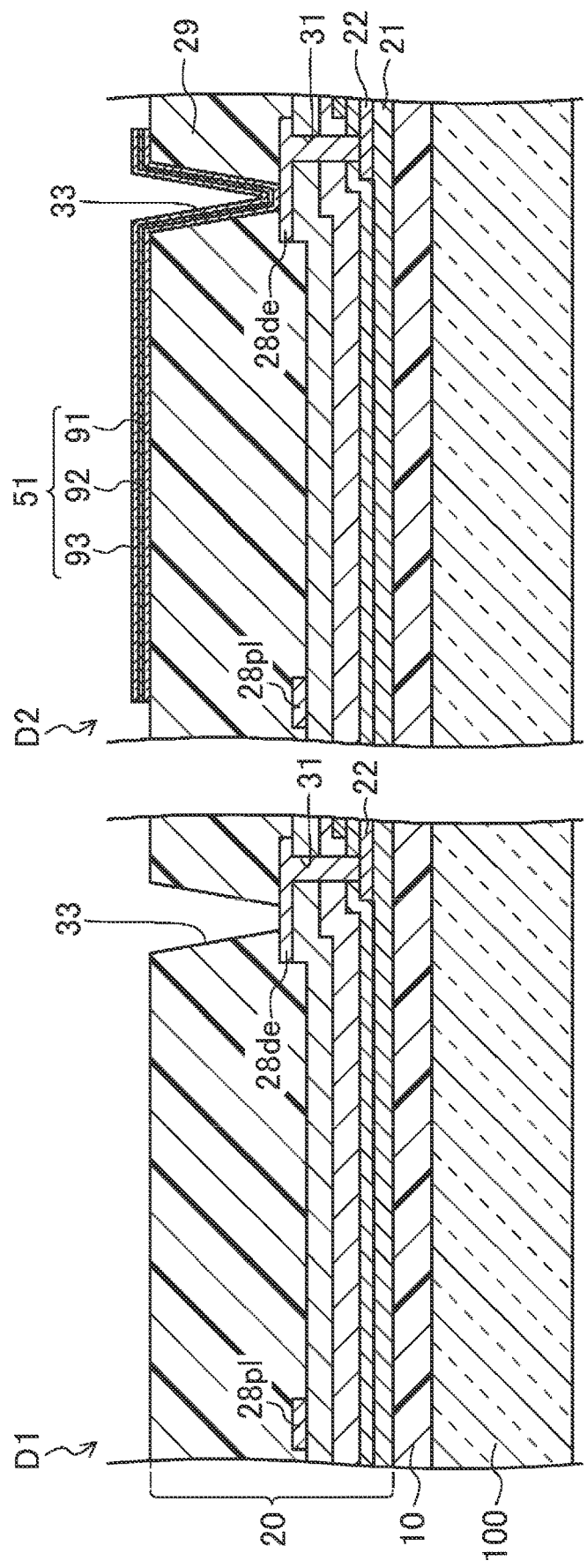
FIG. 24 is a cross-sectional view illustrating main portions of the substrate on which first electrodes have been formed in the first patterning step in the method of manufacturing the organic EL display device according to the second embodiment.

FIG. 23 is a cross-sectional view illustrating main portions of a substrate on which a resist layer 102 has been formed in the first patterning step ST2a-2. FIG. 24 is a cross-sectional view illustrating main portions of a substrate on which the first electrode 51 has been formed in the first patterning step ST2a-2.

In the first patterning step ST2a-2, first, a photosensitive resin material is applied to the substrate on which a layered conductive film 204 constituted by the transparent conductive film 201, the reflective conductive film 202, and the transparent conductive film 203 has been formed, by a known coating method such as a spin coating method. Subsequently, the coating film of the photosensitive resin material is pre-baked, exposed, developed, and post-baked to pattern the coating film, thereby forming the island-shaped resist layer 102 in each region for forming the first electrode 51 in the second display region D2 as illustrated in FIG. 23.

Next, the layered conductive film 204 is subjected to wet etching by being exposed to an etching solution using the resist layer 102 as a mask. By patterning the layered conductive film 204 by wet etching, the second lower transparent conductive layer 91 is formed from the transparent conductive film 201, the second reflective conductive layer 92 is formed from the reflective conductive film 202, and the second upper transparent conductive layer 93 is formed from the transparent conductive film 203 in the second display region D2 as illustrated in FIG. 24. In this manner, a first electrode 51 constituted by the second lower transparent conductive layer 91, the second reflective conductive layer 92, and the second upper transparent conductive layer 93 is formed in the second display region D2.

In the crystallization step ST2a-3, annealing is performed on the substrate on which the first electrode 51 has been formed in the second display region D2, for example, at a temperature of approximately 200° C. to 250° C. for approximately 30 minutes to 120 minutes. In this annealing, the second lower transparent conductive layer 91 and the second upper transparent conductive layer 93 are crystallized by being heated. Since each of the second lower transparent conductive layer 91 and the second upper transparent conductive layer 93 of the present embodiment is equal to or greater than 20 nm and relatively thick, crystallization by annealing is likely to proceed. Thus, the second lower transparent conductive layer 91 and the second upper transparent conductive layer 93 are suitably crystallized.

Figure 25:
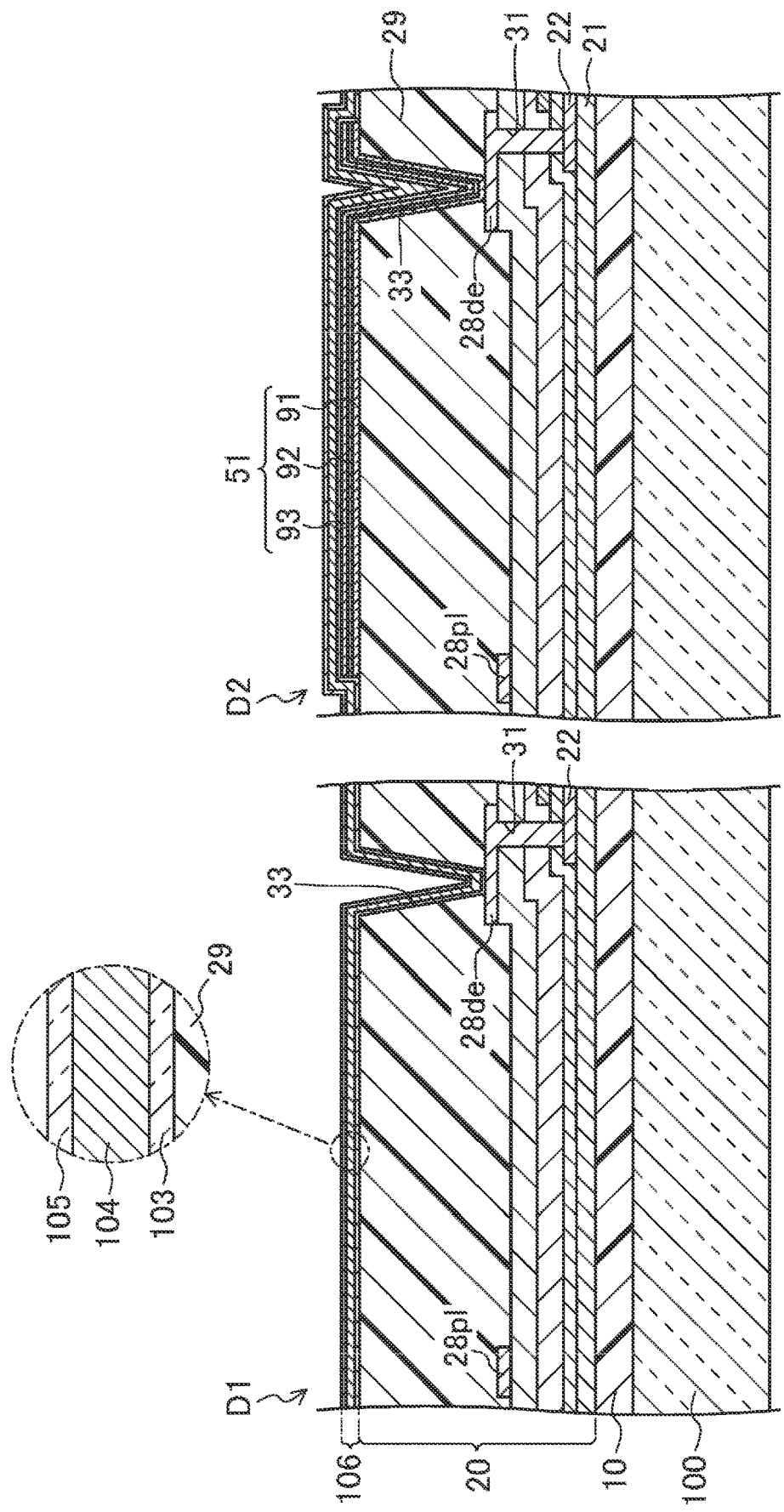
FIG. 25 is a cross-sectional view illustrating main portions of the substrate on which film formation has been performed in a second film forming step in the method of manufacturing the organic EL display device according to the second embodiment.

FIG. 25 is a cross-sectional view illustrating main portions of a substrate on which film formation has been performed in the second film forming step ST2a-4.

As illustrated in FIG. 25, in the second film forming step ST2a-4, the transparent conductive film 103, the reflective conductive film 104, and the transparent conductive film 105 are formed, for example, by a sputtering method so as to be layered in order on the substrate on which the first electrode 51 has been formed in the second display region D2, thereby forming the layered conductive film 106. For example, the thicknesses of the transparent conductive films 103 and 105 that are formed here are set to approximately 10 nm, and the thickness of the reflective conductive film 104 is set to approximately 100 nm.

Figure 26:
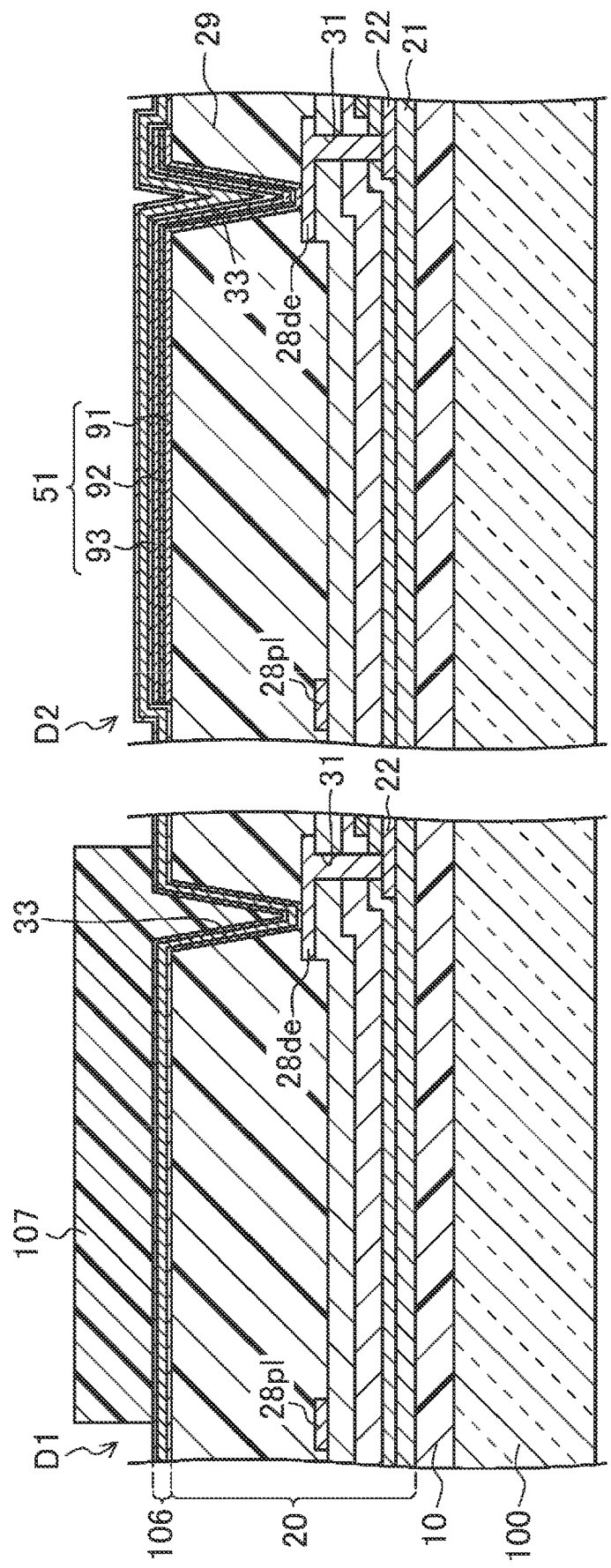
FIG. 26 is a cross-sectional view illustrating main portions of the substrate on which a resist layer has been formed in a second patterning step in the method of manufacturing the organic EL display device according to the second embodiment.
Figure 27:
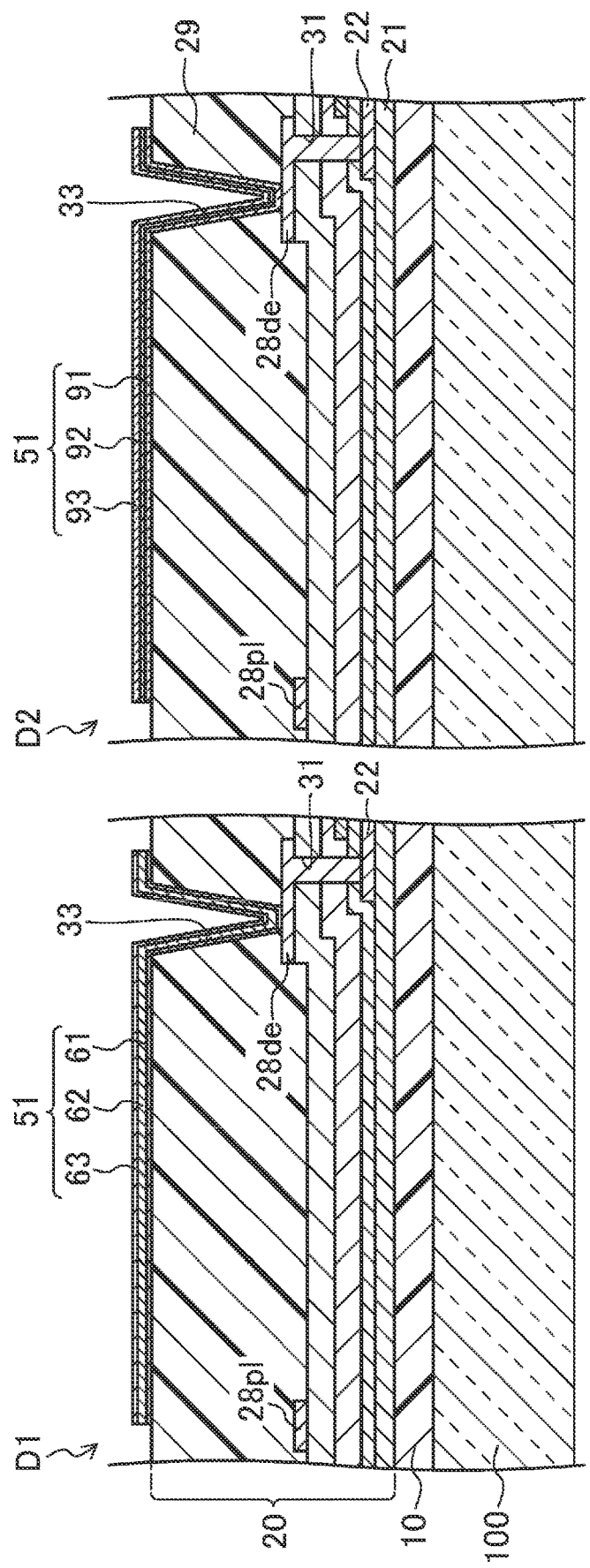
FIG. 27 is a cross-sectional view illustrating main portions of the substrate on which first electrodes have been formed in the second patterning step in the method of manufacturing the organic EL display device according to the second embodiment.

FIG. 26 is a cross-sectional view illustrating main portions of a substrate on which a resist layer 107 has been formed in the second patterning step ST2a-5. FIG. 27 is a cross-sectional view illustrating main portions of a substrate on which the first electrode 51 has been formed in the second patterning step ST2a-5.

In the second patterning step ST2a-5, similarly to the first embodiment, first, the island-shaped resist layer 107 is formed in each region for forming the first electrode 51 in the first display region D1 on the substrate on which the layered conductive film 106 has been formed, as illustrated in FIG. 26. Next, by exposing the layered conductive film 106 to an etching solution using the resist layer 107 as a mask and patterning the layered conductive film 106 by wet etching, the first lower transparent conductive layer 61 is formed from the transparent conductive film 103, the first reflective conductive layer 62 is formed from the reflective conductive film 104, and the first upper transparent conductive layer 63 is formed from the transparent conductive film 105 in the first display region D1, as illustrated in FIG. 27.

In this manner, the first electrode 51 constituted by the first lower transparent conductive layer 61, the first reflective conductive layer 62, and the first upper transparent conductive layer 63 is formed in the first display region D1. At this time, the first electrode 51 in the second display region D2 formed first is exposed to an etching solution for patterning the layered conductive film 106. However, since the second upper transparent conductive layer 93 constituting the first electrode 51 in the second display region D2 is previously crystallized in the crystallization step ST2a-3, damage caused by the infiltration of the etching solution into the first electrode 51 is reduced.

Effects of Second Embodiment

A characteristic (1) of the organic EL display device 1 according to the second embodiment is that the first electrode 51 of the first organic EL element 60A positioned in the first display region D1 includes the first reflective conductive layer 62 having light reflectivity and the first upper transparent conductive layer 63 provided on the first reflective conductive layer 62 and having light transmittance, the first electrode 51 of the second organic EL element 60B positioned in the second display region D2 includes the second reflective conductive layer 92 having light reflectivity and the second upper transparent conductive layer 93 provided on the second reflective conductive layer 92 and having light transmittance, the second reflective conductive layer 92 is thinner than the first reflective conductive layer 62, and the second upper transparent conductive layer 93 is crystallized and thicker than the first upper transparent conductive layer 63.

According to the characteristic (1) of the organic EL display device 1 according to the second embodiment, since the second reflective conductive layer 92 included in the first electrode 51 of the second organic EL element 60B is thinner than the first reflective conductive layer 62 included in the first electrode 51 of the first organic EL element 60A, it is possible to increase the transmittance of light used for imaging of the camera 3 in the display region D. Furthermore, a portion of light emitted by the organic EL layer 53 is reflected by the second reflective conductive layer 92, and the brightness of each subpixel Sp in the second display region D2 can be ensured. Additionally, since the second upper transparent conductive layer 93 included in the first electrode 51 of the second organic EL element 60B is thicker than the first upper transparent conductive layer 63 included in the first electrode 51 of the first organic EL element 60A, the second upper transparent conductive layer 93 is more likely to be crystallized by annealing than the first upper transparent conductive layer 63. Thus, in the manufacture of the organic EL display device 1, the first electrode 51 of the second organic EL element 60B is formed, the second upper transparent conductive layer 93 constituting the first electrode 51 is crystallized, and then the first electrode 51 of the first organic EL element 60A is formed, and thus it is possible to prevent an etching solution at the time of patterning the first electrode 51 of the first organic EL element 60A from infiltrating into the first electrode 51 of the second organic EL element 60B and reduce damage to the first electrode 51 of the second organic EL element 60B.

Characteristics (2) to (6) of the organic EL display device 1 according to the second embodiment are the same as the characteristics (2) to (6) of the organic EL display device 1 according to the first embodiment, and the same effects as those of the characteristics (2) to (6) of the organic EL display device 1 according to the first embodiment can be obtained.

A characteristic (1) of the method of manufacturing the organic EL display device 1 according to the second embodiment is that the first electrode forming step ST2a included in the light-emitting element layer forming step ST2 includes the first steps ST2a-1 and ST2a-2 of forming the reflective conductive film 202 and the transparent conductive film 203 in the order on the substrate on which the TFT layer 20 has been formed and patterning the reflective conductive film 202 and the transparent conductive film 203 by wet etching to form the second reflective conductive layer 92 from the reflective conductive film 202 and form the second upper transparent conductive layer 93 from the transparent conductive film 103 in the second display region D2, the crystallization step ST2a-3 of crystallizing the second upper transparent conductive layer 93 by heating, the second steps ST2a-4 and ST2a-5 of forming the reflective conductive film 104 and the transparent conductive film 105 in order on the substrate on which the second reflective conductive layer 92 and the second upper transparent conductive layer 93 have been formed after the crystallization step ST2a-3 and patterning the reflective conductive film 104 and the transparent conductive film 105 by wet etching to form the first reflective conductive layer 62 from the reflective conductive film 104 and form the first upper transparent conductive layer 63 from the transparent conductive film 105 in the first display region D1, and in the first steps ST2a-1 and ST2a-2, the second reflective conductive layer 92 is formed to be thinner than the first reflective conductive layer 62, and the second transparent conductive layer 65 is formed to be thicker than the first upper transparent conductive layer 63.

According to the characteristic (1) of the method of manufacturing the organic EL display device 1 according to the second embodiment, the second upper transparent conductive layer 93 is formed to be thicker than the first upper transparent conductive layer 63 in the first steps ST2a-1 and ST2a-2, and thus the second upper transparent conductive layer 93 is easily crystallized in the crystallization step ST2a-3. Thereby, it is possible to prevent an etching solution at the time of patterning the first electrode 51 of the first organic EL element 60A in the second steps ST2a-4 and ST2a-5 from infiltrating into the first electrode 51 of the second organic EL element 60B and reduce damage to the first electrode 51 of the second organic EL element 60B.

A characteristic (2) of the method of manufacturing the organic EL display device 1 according to the second embodiment is that, in the first steps ST2*a*-1 and ST2*a*-2, the reflective conductive film 202 is formed before forming the transparent conductive film 203, and the reflective conductive film 202 is patterned together with the transparent conductive film 203 by wet etching, thereby forming, in a layer below the second upper transparent conductive layer 93, the second reflective conductive layer 92 that is thinner than the first reflective conductive layer 62 from the reflective conductive film 202.

According to the characteristic (2) of the method of manufacturing the organic EL display device 1 according to the second embodiment, the second upper transparent conductive layer 93 and the second reflective conductive layer 92 are patterned and formed by the wet etching at the same time in the first steps ST2*a*-1 and ST2*a*-2, and thus it is possible to reduce patterning steps (resist application, exposure, development, and etching) as compared to a case where the second upper transparent conductive layer 93 and the second reflective conductive layer 92 are separately patterned at different timings. This contributes to a reduction in manufacturing costs and an improvement in manufacturing efficiency of the organic EL display device 1.

Modification Example of Second Embodiment

Figure 28:
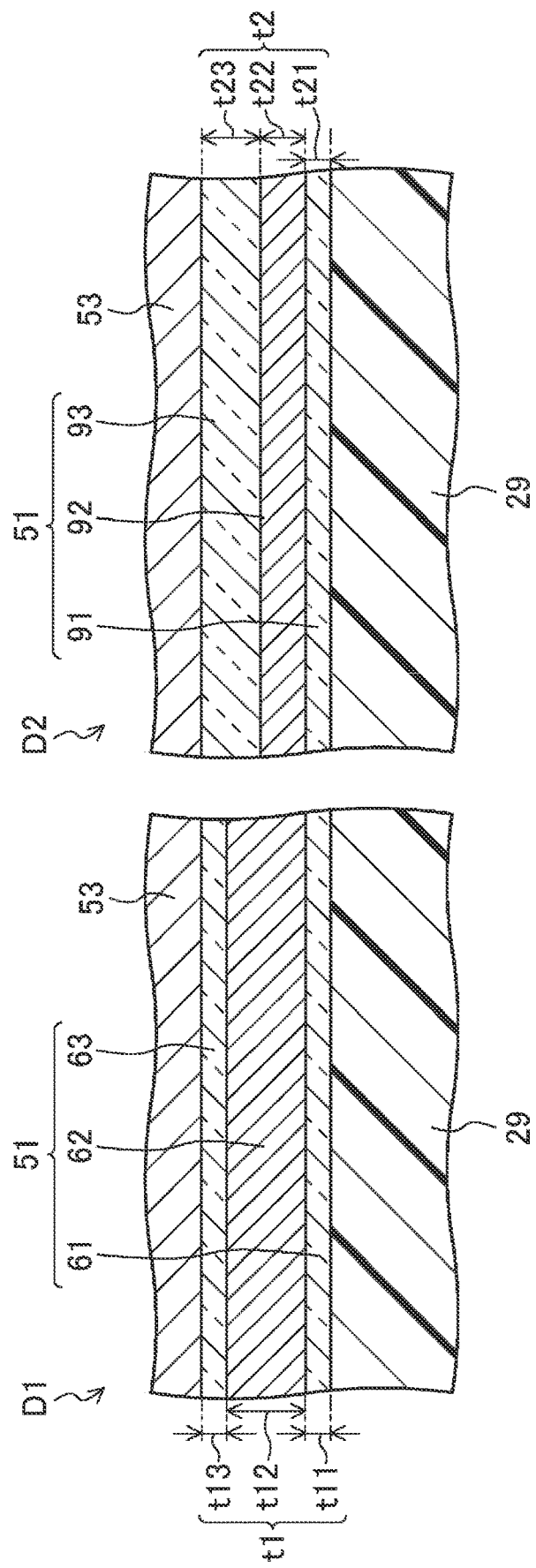
FIG. 28 is a cross-sectional view illustrating a configuration of first electrodes in a first display region and a second display region of the organic EL display device according to a modification example of the second embodiment.

FIG. 28 is a cross-sectional view illustrating configurations of the first electrodes 51 in the first display region D1 and the second display region D2 of the organic EL display device 1 according to the present modification example.

Figure 29:
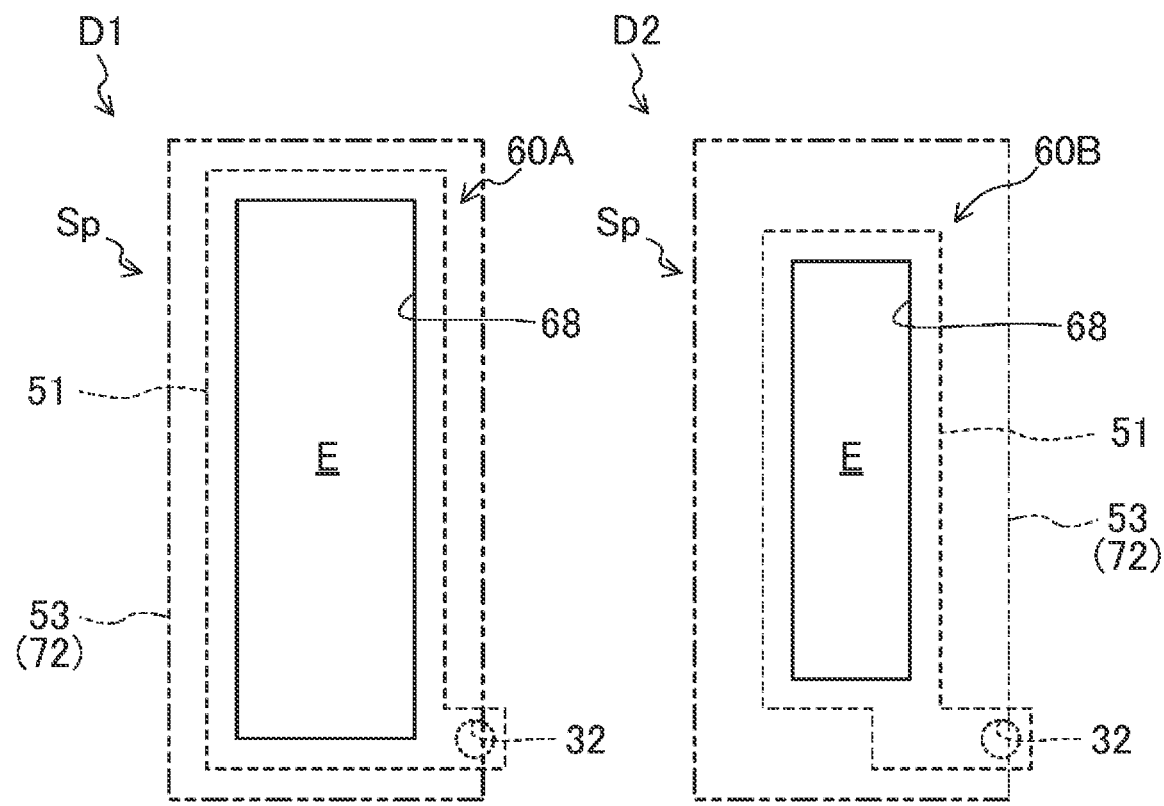
FIG. 29 is a plan view illustrating configurations of light-emitting regions and the peripheral configurations thereof in the first display region and the second display region of the organic EL display device according to modification examples of the first and second embodiments.

In the organic EL display device 1 according to the second embodiment, the thickness t21 of the second lower transparent conductive layer 91 of the second organic EL element 60B and the thickness t23 of the second upper transparent conductive layer 93 are set to be equal to each other. However, as illustrated in FIG. 29, in the organic EL display device 1 according to the present modification example, the second upper transparent conductive layer 93 of the second organic EL element 60B is thicker than the second lower transparent conductive layer 91 (t23>t21). In the present modification example, the thickness t21 of the second lower transparent conductive layer 91 of the second organic EL element 60B is, for example, equal to the thickness t11 of the first lower transparent conductive layer 61 of the first organic EL element 60A.

Effects of Modification Example of Second Embodiment

A characteristic of the organic EL display device 1 according to the modification example of the second embodiment is that the second upper transparent conductive layer 93 of the second organic EL element 60B is thicker than the second lower transparent conductive layer 91.

According to the characteristic of the organic EL display device 1 according to the modification example of the second embodiment, the second upper transparent conductive layer 93 of the second organic EL element 60B is relatively thicker than the second lower transparent conductive layer 91, and thus the second upper transparent conductive layer 93 is more likely to be crystallized than the second lower transparent conductive layer 91 by annealing. Thereby, it is possible to prevent an etching solution at the time of patterning the first electrode 51 of the first organic EL element 60A from infiltrating into the first electrode 51 of the second organic EL element 60B while increasing the transmittance of light in the first electrode 51 of the second organic EL element 60B by making the second lower transparent conductive layer 91 relatively thin.

Modification Examples of First and Second Embodiments

FIG. 29 is a plan view illustrating configurations of light-emitting regions E in the first display region D1 and the second display region D2 of the organic EL display device 1 according to the present modification example.

In the organic EL display device 1 according to the first embodiment, the area of the light-emitting region E of the subpixel Sp in the first display region D1 and the area of the light-emitting region E of the subpixel Sp in the second display region D2 are set to be equal to each other. However, as illustrated in FIG. 29, in the organic EL display device 1 according to the present modification example, the area of the light-emitting region E of the subpixel Sp in the first display region D1 and the area of the light-emitting region E of the subpixel Sp in the second display region D2 are different from each other.

The first electrode 51 of the second organic EL element 60B is formed to have the same shape as the first electrode 51 of the first organic EL element 60A and is formed to be smaller than the first electrode 51 of the first organic EL element 60A. In a plan view, the area of the first electrode 51 of the second organic EL element 60B is smaller than the area of the first electrode 51 of the first organic EL element 60A. The light-emitting layer 72 of the first organic EL element 60A and the light-emitting layer 72 of the second organic EL element 60B are formed to have the same shape and same size. In a plan view, the area of the organic EL layer 53 of the first organic EL element 60A and the area of the organic EL layer 53 of the second organic EL element 60B are equivalent to each other.

In the edge cover 52, the opening 68 that exposes the first electrode 51 of the second organic EL element 60B is formed to have the same shape as the opening 68 that exposes the first electrode 51 of the first organic EL element 60A and have a size smaller than the opening 68 exposing the first electrode 51 of the first organic EL element 60A. The area of the opening 68 that exposes the first electrode 51 of the first organic EL element 60A is larger than the area of the opening 68 that exposes the first electrode 51 of the second organic EL element 60B in a plan view. The area of the light-emitting region E of the subpixels Sp in the first display region D1 is larger than the area of the light-emitting region E of the subpixels Sp in the second display region D2.

Effects of Modification Examples of First and Second Embodiments

A characteristic (1) of the organic EL display device 1 according to the present modification example is that the area of the first electrode 51 of the second organic EL element 60B is smaller than the area of the first electrode 51 of the first organic EL element 60A.

According to the characteristic (1) of the organic EL display device 1 according to the present modification example, the area of the first electrode 51 of the second organic EL element 60B is smaller than the area of the first electrode 51 of the first organic EL element 60A, and thus it is possible to increase the amount of light that passes through the subpixels Sp from the front face side on which an image is displayed in the second display region D2. This contributes to an increase in the amount of light that can be used for image capture by the camera 3 and an improvement in image capture performance of the in-camera 3 which is combined with the organic EL display device 1.

A characteristic (2) of the organic EL display device 1 according to the present modification example is that the area of the organic EL layer 53 of the first organic EL element 60A and the area of the organic EL layer 53 of the second organic EL element 60B are equal to each other.

According to the characteristic (2) of the organic EL display device 1 according to the present modification example, the organic EL layers 53 in the first display region D1 and the organic EL layers 53 in the second display region D2, whose areas are equal to each other in a plan view, can be formed at the same time by vapor deposition without changing a film formation mask. This contributes to manufacturing the organic EL display device 1 in an inexpensive manner. Further, since the film formation mask used in the vapor deposition is generally relatively thin and used in a fixed state while being pulled with an appropriate tension, at the time of its use, a positional shift of the opening can be suppressed, which is caused by variation in the strain applied to the shape of a film formation opening.

A characteristic (3) of the organic EL display device 1 according to the present modification example is that the area of the opening 68 that exposes the first electrode 51 of the first organic EL element 60A is larger than the area of the opening 68 that exposes the first electrode 51 of the second organic EL element 60B in the edge cover 52.

According to the characteristic (3) of the organic EL display device 1 according to the present modification example, the area of the light-emitting region E of the subpixel Sp in the first display region D1 is larger than the area of the light-emitting region E of the subpixel Sp in the second display region D2, and thus it is possible to make the luminance in the subpixel Sp in the first display region D1 higher than the luminance in the subpixel Sp in the second display region D2. Thus, it is possible to secure the brightness of image display in the first display region D1.

As described above, the preferred embodiments and modification examples have been described as examples of the technique of the disclosure. However, the technique of the disclosure is not limited to the embodiments and the modification examples, and is also applicable to an embodiment in which modification, replacement, adding, omission, and the like are suitably made. The constituent elements described in the embodiments described above can be combined into a new embodiment. The constituent elements described in the accompanying drawings and detailed description may also include constituent elements that are not essential for the purpose of solving the problems. As such, those constituent elements that are not essential and are described in the accompanying drawings and detailed description should not immediately be recognized as being essential.

For example, the above-described embodiments and modification examples thereof may have a configuration to be described below.

The first reflective conductive layer 62 constituting the first electrode 51 of the first organic EL element 60A is formed of silver (Ag), a silver alloy, or the like, but the technique of the disclosure is not limited thereto. Silver (Ag), a silver alloy, and the like are merely examples of the material of the first reflective conductive layer 62, and the first reflective conductive layer 62 may be formed of any of other reflective conductive materials such as vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn) as long as the first reflective conductive layer 62 can have light reflectivity. This is the same for the second reflective conductive layer 92 of the second organic EL element 60B in the organic EL display device 1 according to the second embodiment.

Each of the first lower transparent conductive layer 61 and the first upper conductive layer constituting the first electrode 51 of the first organic EL element 60A are formed of indium tin oxide (ITO), indium zinc oxide (IZO), or the like, but the technique of the disclosure is not limited thereto. Indium tin oxide (ITO), indium zinc oxide (IZO), and the like are merely examples of the materials of the first lower transparent conductive layer 61 and the first upper conductive layer, and the first lower transparent conductive layer 61 and the first upper conductive layer may be formed of other transparent conductive materials such as zinc oxide (ZnO) as long as the layers can have light transmittance. This is the same for the second lower transparent conductive layer 91 and the second upper transparent conductive layer 93 of the second organic EL element 60B in the organic EL display device 1 according to the second embodiment.

The area of the organic EL layer 53 of the first organic EL element 60A and the area of the organic EL layer 53 of the second organic EL element 60B are equal to each other above, but the technique of the disclosure is not limited thereto. The area of the organic EL layer 53 of the first organic EL element 60A and the area of the organic EL layer 53 of the second organic EL element 60B are preferably equal to each other, but may be different from each other.

The organic EL layer 53 is individually provided for each of the subpixels Sp above, but the technique of the disclosure is not limited thereto. The organic EL layer 53, including the light-emitting layer 72, may be provided in common for the plurality of subpixels Sp as a continuous layer. In this case, the organic EL display device 1 may include a color filter, for example, to perform color tone expression of each of the subpixels Sp.

Each of the pixels Px is constituted by the subpixels Sp of the three colors above, but the technique of the disclosure is not limited thereto. The subpixels Sp constituting each of the pixels Px are not limited to having the three colors, and may have four or more colors. Further, the subpixels Sp of the three colors constituting each of the pixels Px are provided in the stripe arrangement, but the technique of the disclosure is not limited thereto. The arrangement of the plurality of subpixels Sp constituting each of the pixels Px may be another arrangement such as a PenTile arrangement.

The first TFT 30a, the second TFT 30b, the third TFT 30c, the fourth TFT 30d, the fifth TFT 30e, the sixth TFT 30f, and the seventh TFT 30g are each the top-gate type above, but the technique of the disclosure is not limited thereto. The first TFT 30a, the second TFT 30b, the third TFT 30c, the fourth TFT 30d, the fifth TFT 30e, the sixth TFT 30f, and the seventh TFT 30g may each be a bottom gate type. Further, the TFT 30 provided for each of the subpixels Px may be six or less and eight or more.

The first electrode 51 is the anode and the second electrode 54 is the cathode electrode, but the technique of the disclosure is not limited thereto. The first electrode 51 may be the cathode electrode, and the second electrode 54 may be the anode. In this case, the organic EL layer 53 has an inverted layered structure, for example.

The organic EL layer 53 has a five-layer layered structure constituted by the hole injection layer 70, the hole transport layer 71, the light-emitting layer 72, the electron transport layer 73, and the electron injection layer 74, but the technique of the disclosure is not limited thereto. The organic EL layer 53 may have a three-layer layered structure constituted by a hole injection-cum-transport layer, the light-emitting layer 72, and an electron transport-cum-injection layer, and can adopt any chosen structure.

As the electronic component used in combination with the organic EL display device 1, the camera 3 is illustrated as an example above, but the technique of the disclosure is not limited thereto. The electronic component may be another electronic component such as a fingerprint sensor or a face recognition sensor, as long as the electronic component is disposed at a position overlapping the display region D in a plan view on the back face of the organic EL display device 1, and configured to use the light transmitted through the light-emitting element layer 50, the TFT layer 20, and the resin substrate layer 10.

The organic EL display device 1 is illustrated as an example of a display device, but the technique of the disclosure is not limited thereto. The technique of the disclosure can be applied to a display device provided with a plurality of light-emitting elements driven by a current. For example, the technique of the disclosure is applicable to a display device provided with quantum-dot light emitting diodes (QLEDs), which are light-emitting elements using a quantum dot-containing layer.

The invention claimed is:

1. A display device, comprising:
   a substrate;
   a thin film transistor layer provided on the substrate and including a plurality of thin film transistors;
   a light-emitting element layer provided on the thin film transistor layer and including a plurality of light-emitting elements; and
   a display region displaying an image by light emitted from the plurality of light-emitting elements controlled by operations of the plurality of thin film transistors,
   wherein the display region includes a first display region and a second display region that is positioned inside of the first display region and that transmits a background light,
   each of the plurality of light-emitting elements includes a first light-emitting element positioned in the first display region and a second light-emitting element positioned in the second display region,
   each of the first light-emitting element and the second light-emitting element includes a first electrode provided for each of the plurality of light-emitting elements, a light-emitting function layer provided on the first electrode, and a second electrode provided on the light-emitting function layer,
   the first electrode of the first light-emitting element includes a first reflective conductive layer having light reflectivity, and a first upper transparent conductive layer having light transmittance and being provided on the first reflective conductive layer,
   the first electrode of the second light-emitting element includes a second transparent conductive layer having light transmittance,
   the second transparent conductive layer is crystallized and is thicker than the first upper transparent conductive layer, and
   an area of the first electrode of the first light-emitting element and an area of the first electrode of the second light-emitting element are equal to each other.

2. The display device according to claim 1,
   wherein the first electrode of the second light-emitting element is formed by the second transparent conductive layer.

3. The display device according to claim 1,
   wherein the first electrode of the second light-emitting element further includes, in a layer below the second transparent conductive layer, a second reflective conductive layer having light reflectivity, and
   the second reflective conductive layer is thinner than the first reflective conductive layer.

4. The display device according to claim 3,
   wherein the first electrode of the second light-emitting element includes the second transparent conductive layer as a second upper transparent conductive layer, and further includes, in a layer below the second reflective conductive layer, a second lower transparent conductive layer having light transmittance.

5. The display device according to claim 4,
   wherein the second lower transparent conductive layer is thicker than the first upper transparent conductive layer.

6. The display device according to claim 4,
   wherein the second upper transparent conductive layer is thicker than the second lower transparent conductive layer.

7. The display device according to claim 3,
   wherein the second reflective conductive layer is formed of at least one metal selected from silver, a silver alloy, aluminum, and an aluminum alloy.

8. The display device according to claim 1,
   wherein the first electrode of the second light-emitting element is thinner than the first electrode of the first light-emitting element.

9. The display device according to claim 1,
   wherein the first reflective conductive layer is formed of at least one metal material selected from among silver, a silver alloy, aluminum, and an aluminum alloy.

10. The display device according to claim 1,
    wherein each of the first upper transparent conductive layer and the second transparent conductive layer is formed of at least one transparent conductive oxide selected from between indium tin oxide and indium zinc oxide.

11. A display device, comprising:
    a substrate;
    a thin film transistor layer provided on the substrate and including a plurality of thin film transistors;
    a light-emitting element layer provided on the thin film transistor layer and including a plurality of light-emitting elements; and
    a display region displaying an image by light emitted from the plurality of light-emitting elements controlled by operations of the plurality of thin film transistors,
    wherein the display region includes a first display region and a second display region that is positioned inside of the first display region and that transmits a background light,
    each of the plurality of light-emitting elements includes a first light-emitting element positioned in the first display region and a second light-emitting element positioned in the second display region,
    each of the first light-emitting element and the second light-emitting element includes a first electrode provided for each of the plurality of light-emitting elements, a light-emitting function layer provided on the first electrode, and a second electrode provided on the light-emitting function layer,
    the first electrode of the first light-emitting element includes a first reflective conductive layer having light reflectivity, and a first upper transparent conductive layer having light transmittance and being provided on the first reflective conductive layer,
    the first electrode of the second light-emitting element includes a second transparent conductive layer having light transmittance,
    the second transparent conductive layer is crystallized and is thicker than the first upper transparent conductive layer, the display device further comprises an edge cover covering a peripheral edge portion of the first electrode, a first opening exposing the first electrode of the first light-emitting element is formed in the edge cover, a second opening exposing the first electrode of the second light-emitting element is formed in the edge cover, and an area of the first opening and an area of the second opening are equal to each other.

12. The display device according to claim 11, wherein the first electrode of the second light-emitting element further includes, in a layer below the second transparent conductive layer, a second reflective conductive layer having light reflectivity, and the second reflective conductive layer is thinner than the first reflective conductive layer.

13. The display device according to claim 12, wherein the first electrode of the second light-emitting element includes the second transparent conductive layer as a second upper transparent conductive layer, and further includes, in a layer below the second reflective conductive layer, a second lower transparent conductive layer having light transmittance.

14. The display device according to claim 13, wherein the second lower transparent conductive layer is thicker than the first upper transparent conductive layer.

15. The display device according to claim 13, wherein the second upper transparent conductive layer is thicker than the second lower transparent conductive layer.

16. The display device according to claim 11, wherein the first electrode of the second light-emitting element is thinner than the first electrode of the first light-emitting element.

17. A display device, comprising:

a substrate;

a thin film transistor layer provided on the substrate and including a plurality of thin film transistors;

a light-emitting element layer provided on the thin film transistor layer and including a plurality of light-emitting elements; and a display region displaying an image by light emitted from the plurality of light-emitting elements controlled by operations of the plurality of thin film transistors, wherein the display region includes a first display region and a second display region that is positioned inside of the first display region and that transmits a background light, each of the plurality of light-emitting elements includes a first light-emitting element positioned in the first display region and a second light-emitting element positioned in the second display region, each of the first light-emitting element and the second light-emitting element includes a first electrode provided for each of the plurality of light-emitting elements, a light-emitting function layer provided on the first electrode, and a second electrode provided on the light-emitting function layer, the first electrode of the first light-emitting element includes a first reflective conductive layer having light reflectivity, and a first upper transparent conductive layer having light transmittance and being provided on the first reflective conductive layer, the first electrode of the second light-emitting element includes a second transparent conductive layer having light transmittance, the second transparent conductive layer is crystallized and is thicker than the first upper transparent conductive layer, the display device further comprises an edge cover covering a peripheral edge portion of the first electrode, an opening exposing the first electrode is formed in the edge cover, and an area of the opening exposing the first electrode of the first light-emitting element is larger than an area of the opening exposing the first electrode of the second light-emitting element.

18. The display device according to claim 17, wherein the first electrode of the second light-emitting element further includes, in a layer below the second transparent conductive layer, a second reflective conductive layer having light reflectivity, and the second reflective conductive layer is thinner than the first reflective conductive layer.

19. The display device according to claim 18, wherein the first electrode of the second light-emitting element includes the second transparent conductive layer as a second upper transparent conductive layer, and further includes, in a layer below the second reflective conductive layer, a second lower transparent conductive layer having light transmittance.

20. The display device according to claim 19, wherein the second lower transparent conductive layer is thicker than the first upper transparent conductive layer.

21. The display device according to claim 19, wherein the second upper transparent conductive layer is thicker than the second lower transparent conductive layer.

22. The display device according to claim 18, wherein the second reflective conductive layer is formed of at least one metal selected from silver, a silver alloy, aluminum, and an aluminum alloy.

23. The display device according to claim 17, wherein the first electrode of the second light-emitting element is thinner than the first electrode of the first light-emitting element.

\* \* \* \* \*